United States Patent
Ootsuka

(10) Patent No.: US 9,048,423 B2
(45) Date of Patent: Jun. 2, 2015

(54) MEMORY STORAGE DEVICE AND METHOD OF MANUFACTURING THE SAME

(71) Applicant: Sony Corporation, Tokyo (JP)

(72) Inventor: Wataru Ootsuka, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/469,091

(22) Filed: Aug. 26, 2014

(65) Prior Publication Data

US 2014/0361237 A1    Dec. 11, 2014

Related U.S. Application Data

(60) Continuation of application No. 14/035,117, filed on Sep. 24, 2013, now Pat. No. 8,847,189, which is a division of application No. 13/116,627, filed on May 26, 2011, now Pat. No. 8,575,583.

(30) Foreign Application Priority Data

Jun. 15, 2010   (JP) .................................. 2010-136460

(51) Int. Cl.
  *H01L 29/02*   (2006.01)
  *H01L 45/00*   (2006.01)
  *H01L 27/24*   (2006.01)

(52) U.S. Cl.
  CPC ........ *H01L 45/1253* (2013.01); *H01L 27/2436* (2013.01); *H01L 27/2472* (2013.01); *H01L 45/085* (2013.01); *H01L 45/1233* (2013.01); *H01L 45/1266* (2013.01); *H01L 45/145* (2013.01); *H01L 45/16* (2013.01); *H01L 27/2463* (2013.01); *H01L 45/146* (2013.01); *H01L 45/1675* (2013.01)

(58) Field of Classification Search
USPC .................. 257/2–5, E29.002; 438/102–104
See application file for complete search history.

(56) References Cited

U.S. PATENT DOCUMENTS

| | | |
|---|---|---|
| 2007/0034848 A1 | 2/2007 | Liu |
| 2008/0258128 A1 | 10/2008 | Kuh et al. |
| 2008/0272359 A1 | 11/2008 | Ha et al. |
| 2008/0293183 A1 | 11/2008 | Tsukamoto et al. |
| 2009/0032796 A1 | 2/2009 | Lung |
| 2011/0175181 A1* | 7/2011 | Kang et al. .................... 257/421 |

OTHER PUBLICATIONS

"Electrode" The American Heritage Science Dictionary Copyright 2005 by Houghton Mifflin Company, published by Houghton Mifflin Company.
Park, et al., "Fully Integrated 56 nm DRAM Technology for 1 Gb DRAM"; 2007 Symposium on VLSI Technology Digest of Technical Papers.
Wei, et al., "Highly Reliable TaOx ReRAM and Direct Evidence of Redox Reaction Mechanism" 12-2, IEDM 2008.

* cited by examiner

*Primary Examiner* — Jami M Valentine
(74) *Attorney, Agent, or Firm* — Dentons US LLP

(57) ABSTRACT

A memory storage device including a lower electrode formed to be separate for each of a plurality of memory cells; a memory storage layer formed on the lower electrode and capable of recording information according to a change in resistance; and an upper electrode formed on the memory storage layer. The memory storage device includes a first layer formed of metal or metal silicide and a second layer formed on the first layer and formed of a metal nitride, the lower electrode is formed by lamination of the first layer and the second layer and formed such that only the first layer is in contact with a lower layer and only the second layer is in contact with the memory storage layer, which is an upper layer. The memory storage layer and the upper electrode are formed in common to plural memory cells.

7 Claims, 18 Drawing Sheets

MEMORY STORAGE DEVICE AND METHOD OF MANUFACTURING THE SAME

RELATED APPLICATION DATA

This application is a continuation of U.S. patent application Ser. No. 14/035,117 filed Sep. 24, 2013, which is a division of U.S. patent application Ser. No. 13/116,627 filed May 26, 2011, now U.S. Pat. No. 8,575,583 issued on Nov. 5, 2013, the entireties of which are incorporated herein by reference to the extent permitted by law. The present application claims the benefit of priority to Japanese Patent Application No. JP 2010-136460 filed on Jun. 15, 2010, in the Japan Patent Office, the entirety of which is incorporated by reference herein to the extent permitted by law.

FIELD

The present disclosure relates to a memory storage device including a variable resistance memory storage element and a method of manufacturing the memory storage device.

BACKGROUND

In the past, a variable resistance nonvolatile memory storage element has been proposed.

In the variable resistance nonvolatile memory storage element, a memory storage layer for storing information according to resistance is formed using a material whose resistance changes (hereinafter referred to as variable resistive material).

For example, an insulative film (a high-resistance film) is used as the memory storage layer. The memory storage layer is held between a lower electrode and an upper electrode to form a memory storage element. A memory storage device operating at high speed (so-called ReRAM) is configured using the memory storage element.

As a type of the variable resistance nonvolatile memory storage element, there is proposed a memory storage element configured by laminating a memory storage layer that stores information according to a change in resistance of the memory storage layer and an ion source layer containing elements that are movable as ions.

The memory storage element having this configuration adopts, for example, a structure in which the memory storage layer and the ion source layer are held between a lower electrode and an upper electrode. The ion source layer contains elements such as Cu, Ag, Zn, and Al as elements that change to ions. In the memory storage layer, any one of a tantalum oxide, a niobium oxide, an aluminum oxide, a hafnium oxide, and a zirconium oxide or a mixed material of the oxides can be used.

For example, the memory storage layer is arranged on the lower electrode side and the ion source layer is arranged on the upper electrode side to form the memory storage element. If a plus voltage is applied to the upper electrode with respect to the lower electrode, the elements such as Cu in the ion source layer are ionized, intrude into the memory storage layer through an electric field, and form a filament in the memory storage layer. Consequently, the memory storage layer changes to a low-resistance state. If a minus voltage is applied to the upper electrode with respect to the lower electrode when the memory storage layer is in the low-resistance state, the filament formed in the memory storage layer is oxidized and the memory storage layer returns to an original insulated state (a high-resistance state).

In the variable resistance nonvolatile memory storage element, the lower electrode is an important element for determining a switching characteristic of the memory storage element.

The lower electrode alone does not determine the characteristic. Consistency with the memory storage layer (a switching layer) is important (see, for example, Z. Wei et al., "Highly Reliable TaOx ReRAM and Direct Evidence of Redox Reaction Mechanism", 12-2, IEDM2008).

A relation between electrode potentials (standard electrode potentials) and work functions of various metal elements is shown in FIG. 15. In FIG. 15, metal elements surrounded by a dotted line have positive electrode potentials.

If a material that easily oxidized or reduced is used in the lower electrode, the characteristic of the memory storage layer is deteriorated.

In order to actually control, at high speed, the memory storage element containing the variable resistive material, it is necessary to add transistors for selecting a memory storage element to memory storage elements of memory cells to form a memory cell array.

When a 1T1R memory cell array is fabricated at high density from a transistor T and a memory storage element R, since the structure of the 1T1R memory cell array is similar to the structure of 1T1C of a so-called DRAM, high density can be most easily realized by replacing a capacitor C of the DRAM with the memory storage element R.

Therefore, when the variable resistance nonvolatile memory storage element is used, for example, a memory cell array only has to be formed as indicated by a circuit diagram shown in FIG. 16.

As shown in FIG. 16, memory cells include memory storage elements 101 and transistors 102.

In the figure, reference numeral 103 denotes wires for selecting rows of the memory cells and controlling on and off of the transistors 102, 104 denotes wires for selecting columns of the memory cells, and 105 denotes wires for supplying potentials (a ground potential, a power supply potential, etc.) to the memory storage elements 101.

In the structure of a general DRAM, in general, polysilicon (in general, doped in an N type) is used in a storage node contact (a connection hole that connects a capacitor and a substrate) (see, for example, Y. K. Park et al., "Fully Integrated 56 nm DRAM Technology for 1 Gb DRAM", 10B-4, VLSI tech 2007).

On the other hand, as explained above, in the so-called ReRAM, the lower electrode is an extremely important element that determines a switching characteristic. An appropriate lower electrode has to be fabricated between the polysilicon (so-called polysilicon plug) of the connection hole and the memory storage layer.

For example, in the memory storage element formed by laminating the memory storage layer and the ion source layer, a material of the lower electrode is desirably a stable electrode material, which is less easily oxidized, because generation and elimination of a metal filament by a reversible electric field (voltage) are principles.

Candidates of such an electrode material include a metal nitride such as TiN, WN, TaN, and ZrN or a metal silicide film of TiSi, NiSi, TaSi, WSi, CoSi, or the like.

In a memory storage device (a memory) including the variable resistance nonvolatile memory storage element, in order to realize a reduction in size and an increase in a storage capacity of the memory storage device, it is demanded to reduce the size of memory cells included in the memory storage device and integrate a larger number of memory cells.

In the past, it has been proposed to separate the variable resistive material of the memory storage layer for each of the memory cells through etching or the like.

An example of a method of manufacturing the memory storage device in this case is explained with reference to FIGS. 17A to 17D.

First, as shown in FIG. 17A, plug layers 52 are formed of polysilicon in an insulating layer 51.

Thereafter, as shown in FIG. 17B, a lower electrode 53, a memory storage layer 54, and an upper electrode 55 are sequentially formed over the entire surface on the plug layers 52.

As shown in FIG. 17C, resist patterns are formed.

Patterning is performed by dry etching using the resist patterns as masks. Consequently, as shown in FIG. 17D, memory storage elements 60 including the lower electrode 53, the memory storage layer 54, and the upper electrode 55 are formed on the plug layers 52 in patterns separated for each of memory cells.

In the case of this structure, a new material or a material rarely used in a semiconductor device, which is used in the memory storage layer 54, needs to be etched and processed for each of bits or each of bit lines.

In general, it is difficult to micro-process a high-resistance film containing an etching resisting material such as Cu. As a result, processing is performed at a loose pitch and memory cells are increased in size. Therefore, it is difficult to realize an increase in the density of a memory.

On the other hand, the memory storage layer containing the variable resistive material such as an oxide has resistance sufficiently higher than other layers. Therefore, even if only the lower electrode or the upper electrode is separated for each of bits, short-circuit with adjacent memory cells does not occur in the memory storage layer.

Therefore, a structure in which only the lower electrode is separated for each of memory cells and the memory storage layer is formed on the lower electrode is examined.

SUMMARY

In the memory storage element in which the variable resistive material is used in the memory storage layer, when only the lower electrode is separated for each of memory cells and the memory storage layer is formed on the lower electrode, manufacturing methods explained below are conceivable.

A first manufacturing method is explained below.

As shown in FIG. 18A, the plug layers 52 are formed of polysilicon in the insulating layer 51. The formation of the plug layers 52 is the same as that shown in FIG. 17A.

Subsequently, an interlayer insulating layer 56 (in general, $SiO_2$, SiN, etc.) for separating the lower electrode to be formed later is formed.

A resist 62 is applied on the interlayer insulating layer 56 and a part of the resist 62 is removed by lithography to open patterns for the lower electrode on the plug layers 52 as shown in FIG. 18B.

A dry etching step for the interlayer insulating layer 56 and a removing step for the resist 62 are performed to form connection holes for embedding the lower electrode on the plug layers 52 as shown in FIG. 18C.

As shown in FIG. 19D, a Ti film 57 is formed on the surface in thickness smaller than the depth of the connection holes among the interlayer insulating layers 56. Consequently, in the connection holes, the Ti film 57 is formed in contact with the plug layers 52.

Further, as shown in FIG. 19E, a TiN layer 58 is formed on the surface in thickness for completely filling the connection holes.

The surface is planarized by a CMP (chemical mechanical polishing) method. Consequently, as shown in FIG. 19F, the Ti film 57 and the TiN layer 58 on the interlayer insulating layers 56 are removed and the Ti film 57 and the TiN layer 58 remain only in the connection holes on the plug layers 52.

Thereafter, the memory storage layer 54 and the upper electrode 55 are sequentially formed. As shown in FIG. 19G, the memory storage element 60 including the lower electrodes 53, the memory storage layer 54, and the upper electrode 55 is formed.

In the case of this structure, the lower electrodes 53 include the Ti films 57 and the TiN films 58 on the Ti films 57.

In this structure, interfaces between the plug layers 52 formed of polysilicon and the lower electrodes 53 are only the Ti films 57. Therefore, ohmic junction can be performed in the interfaces and contact resistance decreases.

However, in the structure obtained in this first manufacturing method, pure metal (Ti) is present in a part of the lower electrodes 53 in contact with the memory storage layer 54. Since the metal Ti is a material that is easily oxidized, the metal Ti easily intrudes into the memory storage layer 54 through an electric filed for a switching operation and considerably deteriorates a switching characteristic.

A second manufacturing method is explained below.

First, steps same as the steps shown in FIGS. 18A to 18C are performed. The connection holes are formed on the plug layers 52.

Subsequently, as shown in FIG. 20D, the TiN layer 58 is formed on the surface in thickness for completely filling the connection holes.

The surface is planarized by the CMP method. Consequently, as shown in FIG. 20E, the TiN layer 58 on the interlayer insulating layers 56 is removed and the TiN layer 58 remains only in the connection holes on the plug layers 52.

Thereafter, the memory storage layer 54 and the upper electrode 55 are sequentially formed. As shown in FIG. 20F, the memory storage element 60 including the lower electrodes 53, the memory storage layer 54, and the upper electrode 55 is formed. In the case of this structure, the lower electrodes 53 include the TiN layers 58.

In this structure, since pure metal (Ti, etc.) is not present on the surfaces of the lower electrodes 53, intrusion of metal into the memory storage layer 54 can be suppressed. The problem of the structure obtained in the first manufacturing method can be solved.

However, in this structure, interfaces between the plug layers 52 formed of polysilicon and the lower electrodes 53 are only the TiN layers 58. Therefore, ohmic junction may not able to be performed in the interfaces and contact resistance increases.

Therefore, a deficiency in operation occurs in that, for example, it is difficult to apply desired current and voltage.

Therefore, when it is attempted to separate all the layers (the lower electrodes, the memory storage layer, and the upper electrode) of the memory storage element for each of memory cells and process the layers, it is difficult to increase the density of the memory storage device because of difficulty in processing of the materials of the memory storage layer and the like.

In the case of the structure in which only the lower electrode is separated for each of memory cells, pure metal (Ti, Ni, W, Co, etc.) for reduction of contact resistance with the polysilicon plug is in contact with the memory storage layer. Therefore, the switching characteristic is deteriorated.

Therefore, it is desirable to provide a memory storage device and a method of manufacturing the memory storage device that can reduce contact resistance between a lower electrode and a lower layer and obtain a satisfactory switching characteristic.

According to an embodiment of the present disclosure, there is provided a memory storage device including a lower electrode formed to be separated for each of memory cells, a memory storage layer formed on the lower electrode and capable of recording information according to a change in resistance, and an upper electrode formed on the memory storage layer.

The memory storage device includes a first layer formed of metal or metal silicide and a second layer formed on the first layer and formed of a metal nitride.

The memory storage device includes the lower electrode formed by lamination of the first layer and the second layer and formed such that only the first layer is in contact with a lower layer and only the second layer is in contact with the memory storage layer, which is an upper layer.

The memory storage device further includes the memory storage layer formed in common to plural memory cells and the upper electrode formed in common to the plural memory cells.

According to another embodiment of the present disclosure, there is provided a memory storage device including a lower electrode formed to be separated for each of memory cells, a memory storage layer formed on the lower electrode and capable of recording information according to a change in resistance, and an upper electrode formed on the memory storage layer.

The memory storage device includes the lower electrode including a layer formed of metal silicide and a plug layer formed in contact with a lower layer of the lower electrode and formed of polysilicon.

The memory storage device further includes the memory storage layer formed in common to plural memory cells and the upper electrode formed in common to the plural memory cells.

According to still another embodiment of the present disclosure, there is provided a method of manufacturing a memory storage device including a lower electrode formed to be separated for each of memory cells, a memory storage layer formed on the lower electrode and capable of recording information according to a change in resistance, and an upper electrode formed on the memory storage layer.

The method includes forming, in an insulating layer, a connection hole for connection to a lower layer, forming a metal film in thickness smaller than the depth of the connection hole, and filling the connection hole and forming a metal nitride layer on the surface.

The method includes removing the metal film and the metal nitride layer present on the insulating layer, nitriding a portion near the surface in the metal film and forming the metal nitride layer, forming, in common to plural memory cells, the memory storage layer and the upper electrode on the lower electrode including the metal film and the metal nitride layer.

According to yet another embodiment of the present disclosure, there is provided a method of manufacturing a memory storage device including a lower electrode formed to be separated for each of memory cells, a memory storage layer formed on the lower electrode and capable of recording information according to a change in resistance, and an upper electrode formed on the memory storage layer.

The method includes forming, in an insulating layer, a connection hole for connection to a silicon layer, which is a lower layer, forming a metal film in thickness smaller than the depth of the connection hole, and causing the silicon layer and the metal film in a portion in contact with the silicon layer to react with each other and forming a metal silicide layer.

The method includes removing the metal film not reacting with the silicon layer, filling the connection hole and forming a metal nitride layer on the surface, and removing the metal nitride layer on the insulating layer.

The method further includes forming, in common to plural memory cells, the memory storage layer and the upper electrode on the lower electrode including the metal silicide layer and the metal nitride layer.

According to still yet another embodiment of the present disclosure, there is provided a method of manufacturing a memory storage device including a lower electrode formed to be separated for each of memory cells, a memory storage layer formed on the lower electrode and capable of recording information according to a change in resistance, and an upper electrode formed on the memory storage layer.

The method include forming, in an insulating layer, a plug layer formed of polysilicon, forming a metal film on the surface, causing the plug layer and the metal layer in a portion in contact with the plug layer to react with each other and forming a metal silicide layer, and removing the metal film not reacting with the plug layer.

The method includes forming, in common to plural memory cells, the memory storage layer and the upper electrode on the lower electrode including the metal silicide layer.

With the configuration of the memory storage device according to the embodiment, the lower electrode is formed by the lamination of the first layer formed of metal or metal silicide and the second layer formed on the first layer and formed of metal nitride. Only the first layer is in contact with the lower layer of the lower electrode and only the second layer is in contact with the memory storage layer, which is the upper layer of the lower electrode.

Since only the first layer formed of metal or metal silicide is in contact with the lower layer, contact resistance with the lower layer decreases.

Since only the second layer formed of metal nitride is in contact with the memory storage layer, which is the upper layer, it is possible to suppress metal from intruding into the memory storage layer.

With the configuration of the memory storage device according to the another embodiment, the lower electrode includes the layer formed of metal silicide and the plug layer formed of polysilicon is in contact with the lower layer of the lower electrode.

Since the metal silicide of the lower electrode is in contact with the plug layer formed of polysilicon, which is the lower layer, contact resistance with the plug layer decreases.

Since the metal silicide of the lower electrode is in contact with the memory storage layer, which is the upper layer, it is possible to suppress metal from intruding into the memory storage layer.

With the method of manufacturing the memory storage device according to the still another embodiment, since the connection hole is formed in the insulating layer and the metal film is formed in thickness smaller than the depth of the connection hole, the metal film is formed along the bottom surface and the sidewall surface of the connection hole.

Since the metal nitride layer is formed on the surface to fill the connection hole, the metal nitride layer is formed to fill a space on the metal film in the connection hole. The metal film and the metal nitride layer on the insulating layer are removed, whereby the metal film and the metal nitride layer remain only in the connection hole.

Since the portion near the surface in the metal film is nitrided to form the metal nitride layer and the memory storage layer is formed on the lower electrode including the metal film and the metal nitride layer, only the metal nitride layer in the lower electrode is in contact with the memory storage layer. Consequently, since metal is not in contact with the memory storage layer, it is possible to suppress metal from intruding into the memory storage layer.

Since the metal film is formed on the bottom surface of the connection hole, the metal film is in contact with the lower layer of the lower electrode. Consequently, it is possible to set contact resistance with the lower layer satisfactorily.

With the method of manufacturing the memory storage device according to the yet another embodiment, since the connection hole is formed in the insulating layer and the metal film is formed in thickness smaller than the depth of the connection hole, the metal film is formed along the bottom surface and the sidewall surface of the connection hole.

Since the silicon layer, which is the lower layer, and the metal film in the portion in contact with the silicon layer are caused to react with each other to form the metal silicide layer, the metal silicide layer is formed in contact with the silicon layer on the bottom surface of the connection hole.

Further, since the metal film not reacting with the silicon layer is removed, the connection hole is filled, and the metal nitride layer is formed on the surface, the metal nitride layer is formed to fill a space on the metal silicide layer in the connection hole.

The metal nitride layer on the insulating layer is removed, whereby the metal silicide layer and the metal nitride layer remain in the connection hole.

Further, since the memory storage layer is formed on the lower electrode including the metal silicide layer and the metal nitride layer, only the metal nitride layer in the lower electrode is in contact with the memory storage layer. Consequently, since metal is not in contact with the memory storage layer, it is possible to suppress metal from intruding into the memory storage layer.

Since the metal silicide layer is formed on the bottom surface of the connection hole, the metal silicide layer is in contact with the lower layer of the lower electrode. Consequently, it is possible to set contact resistance with the lower layer satisfactorily.

With the method of manufacturing the memory storage device according to the still yet another embodiment, the plug layer formed of polysilicon is formed in the insulating layer, the metal layer is formed on the surface, and then the metal film in the portion in contact with the plug layer is caused to react with the plug layer to form the metal silicide layer. Consequently, the metal silicide layer is formed in self-alignment with the plug layer.

Since the metal film not reacting with plug layer is removed, only the insulating layer and the metal silicide layer are exposed on the surface.

Further, since the memory storage layer is formed on the lower electrode including the metal silicide layer, the memory storage layer is formed in contact with the metal silicide layer. Consequently, since metal is not in contact with the memory storage layer, it is possible to suppress metal from intruding into the memory storage layer.

Since the metal silicide layer is in contact with the plug layer, contact resistance with the plug layer can be set satisfactorily.

With the memory storage devices according to the embodiments, since contact resistance between the lower electrode and the lower layer can be reduced, it is possible to apply desired current and voltage to the memory cells.

Since intrusion of metal into the memory storage layer can be suppressed, it is possible to obtain a satisfactory switching characteristic in the memory cells.

With the methods of manufacturing the semiconductor device according to the embodiments, it is possible to manufacture a memory storage device having a structure that can reduce contact resistance between the lower electrode and the lower layer and suppress intrusion of metal into the memory storage layer. Consequently, it is possible to manufacture a memory storage device that can apply desired current and voltage to the memory cells and obtain a satisfactory switching characteristic in the memory cells.

According to the embodiments, it is possible to apply desired current and voltage to the memory cells and obtain a satisfactory switching characteristic.

Therefore, it is possible to accurately and stably perform recording of information in the memory cells and realize a memory storage device having high reliability.

DETAILED DESCRIPTION

Best modes for carrying out the present disclosure (hereinafter referred to as embodiments) are explained below. The embodiments are explained in the following order.

1. First Embodiment
2. Second Embodiment
3. Third Embodiment
4. Fourth Embodiment
5. Fifth Embodiment <1. First Embodiment>

Figure 1:
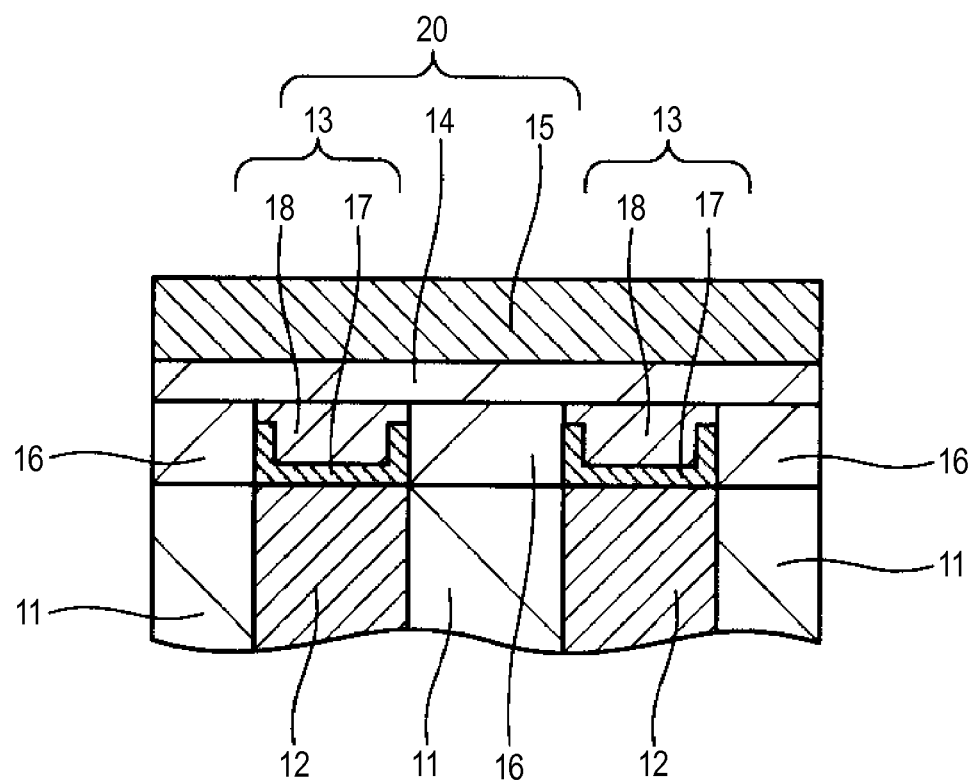
FIG. 1 is a schematic diagram (sectional view) of a memory storage device according to a first embodiment of the present disclosure.

A schematic diagram (sectional view) of a memory storage device according to a first embodiment of the present disclosure is shown in FIG. 1.

In the memory storage device (a memory) according to this embodiment, a large number of memory cells including memory storage elements having memory storage layers capable of recording information according to a change in resistance are arranged to form a memory cell array.

In FIG. 1, a sectional view of two memory cells in the memory storage device having this configuration is shown. Actually, a large number of memory cells having a configuration same as that of the memory cells shown in FIG. 1 are formed to configure the memory storage device.

As shown in FIG. 1, plug layers 12 formed of polysilicon (polycrystalline silicon) are formed to fill the inside of via holes formed in an insulating layer 11. The plug layers 12 are connected to a not-shown wiring layer or semiconductor layer provided below the plug layers 12. An example of the semiconductor layer connected to the plug layer 12 includes a source/drain region of a MOS transistor formed in the semiconductor layer.

Layers forming memory storage elements 20 are formed on the plug layers 12.

In this embodiment, the memory storage elements 20 include lower electrodes 13, a memory storage layer 14 capable of recording information according to a change in resistance, and an upper electrode 15.

The memory storage layer 14 and the upper electrode 15 of the memory storage elements 20 are formed to extend from left to right in the figure and formed in common to all the memory cells of the memory cell array.

The lower electrodes 13 included in the memory storage elements 20 are separated for each of the memory cells by an interlayer insulating layer 16 and formed to be connected to the plug layers 12.

Figure 19D:
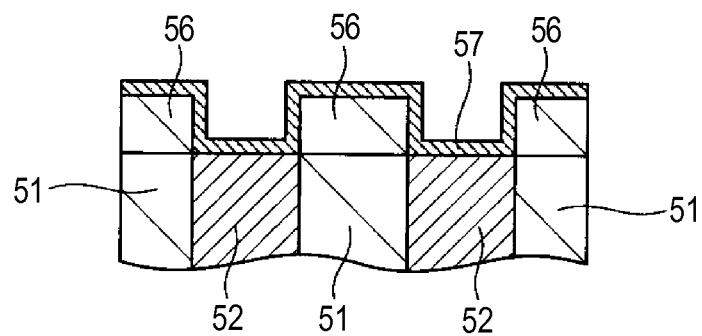
FIGS. 19D to 19G are manufacturing process charts for explaining the first method of manufacturing the memory storage device having the structure in which only a lower electrode is separated for each of memory cells.
Figure 19E:
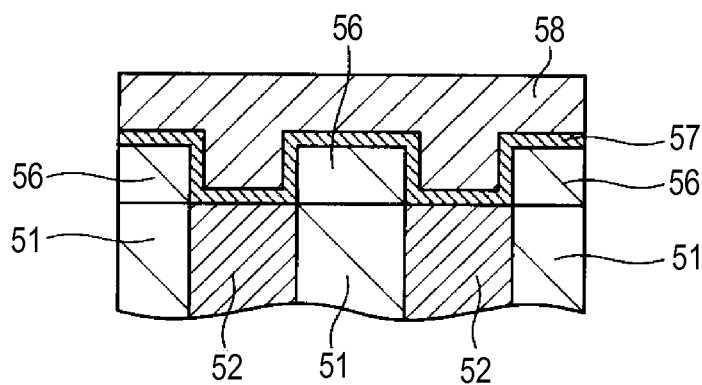
Figure 19F:
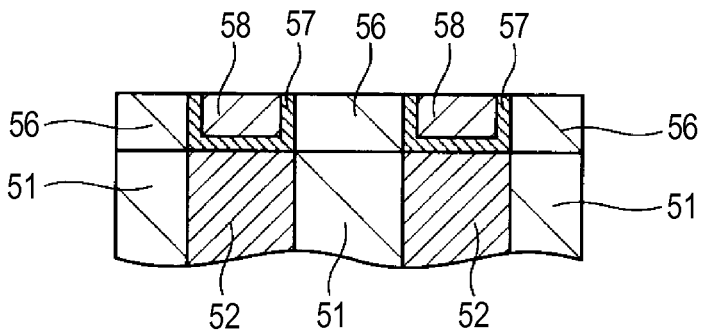
Figure 19G:
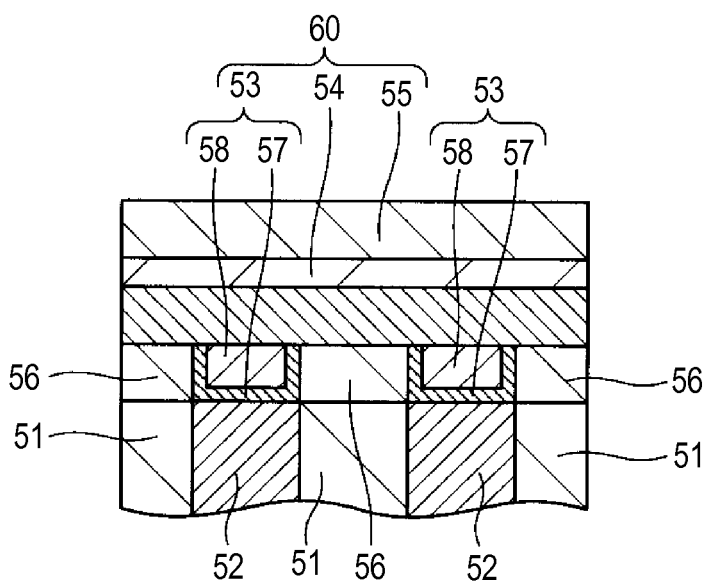
Figure 20D:
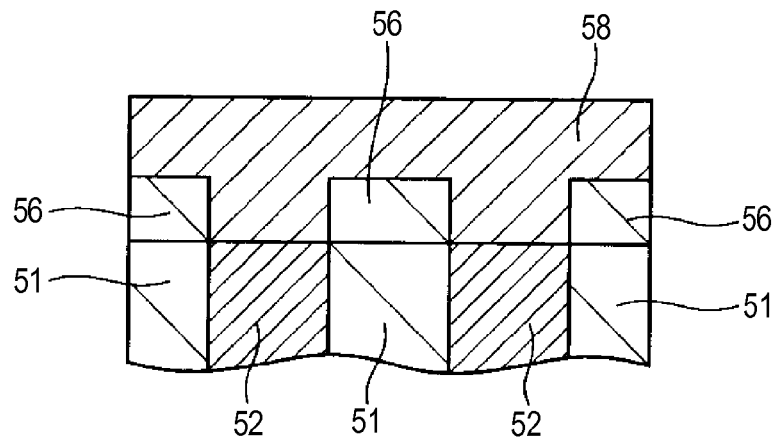
FIGS. 20D to 20F are manufacturing process charts for explaining a second method of manufacturing the memory storage device having the structure in which only a lower electrode is separated for each of memory cells.
Figure 20E:
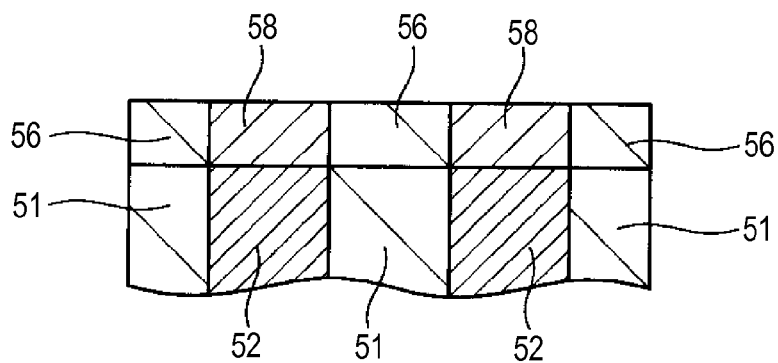
Figure 20F:
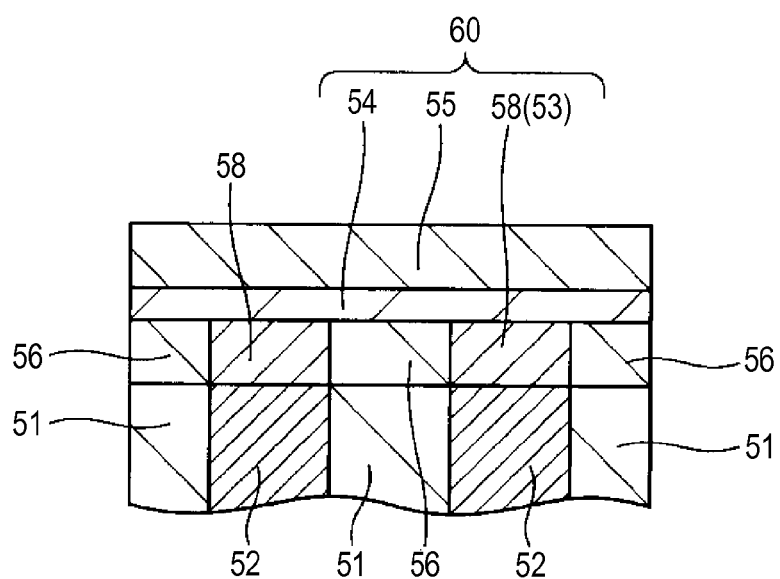

The lower electrodes 13 include metal films 17, which are first layers, and metal nitride layers 18, which are second layers, on the metal films 17. This structure is the same as the structure shown in FIG. 19G.

In a general semiconductor device, metal is used in a plug layer.

However, in the memory storage device having the configuration shown in FIG. 1, in order to miniaturize the memory cells and increase a storage capacity, it is necessary to reduce the width of the via holes, in which the plug layers 12 are embedded and formed, as much as possible.

Metal used in the plug layer of the general semiconductor device has poor capability of being embedded in narrow via holes.

Therefore, in the memory storage device according to this embodiment, polysilicon used in a node contact of the DRAM and having satisfactory capability of being embedded in narrow via holes is used in the plug layers 12.

A material other than polysilicon can be used in the plug layers 12 as long as the material is a conductive material having satisfactory capability of being embedded in narrow via holes.

As a material of the metal films 17, for example, one or more kinds of metal selected out of Ti, Co, Ni, W, and Ta and an alloy containing the metal as a main component can be used.

As a material of the metal nitride layers 18, a nitride of the metal of the metal films 17 can be used. For example, TiN, CoN, NiN, WN, or TaN can be used.

In the memory storage layer 14, a material whose resistance changes is used to make it possible to record information according to a change in resistance.

When the memory storage elements 20 are formed to make it possible to change resistance in the memory storage layer 14 alone, as the material of the memory storage layer 14, a material whose resistance changes according to, for example, a phase change between crystal and non-crystal or a change in a state of a compound. For example, a phase change material such as GeSbTe, a composite oxide having a perovskite structure such as $Pr_{1-x}Ca_xMnO_3$ (PCMO), other composite oxides, or an oxide such as cobalt oxide or tantalum oxide can be used.

In particular, when an ion source layer is provided in contact with the memory storage layer 14 to form the memory storage elements 20, it is advisable to use, as the material of the memory storage layer 14, oxides of one or more kinds of elements (metal elements) selected out of Ta, Nb, Al, Hf, Zr, Ni, Co, and Ce.

When the memory storage elements 20 are formed to make it possible to change resistance in the memory storage layer 14 alone, a general electrode material can be used as a material of the upper electrode 15.

In particular, when the ion source layer is provided in contact with the memory storage layer 14 to form the memory storage elements 20, the upper electrode 15 only has to be configured to also serve as the ion source layer or the upper electrode 15 only has to be configured in a laminated structure of the ion source layer and an electrode material layer.

As a material of the ion source layer in this case, a material containing at least one kind of element, which changes to an ion, selected out of Cu, Ag, Zn, Al, and Zr is used. It is more desirable to use, as the material of the ion source layer, a material containing these elements and at least one kind of element selected out of Te, S, and Se.

In this embodiment, in particular, the metal films 17, which are the first layers, of the lower electrodes 13 are not formed in portions on the surfaces of the lower electrodes 13 but are formed to be retracted from the surfaces. This structure is different from the structure shown in FIG. 19G.

Consequently, the metal films 17 are not in contact with the memory storage layer 14. Only the metal nitride layers 18 in the lower electrodes 13 are in contact with the memory storage layer 14. Since only the metal nitride layers 18 are in contact with the memory storage layer 14, it is possible to suppress intrusion of metal such as Ti into the memory storage layer 14.

Only the metal films 17 in the lower electrodes 13 are in contact with the plug layers 12 formed of polysilicon. Since only the metal films 17 are in contact with the plug layers 12, it is possible to reduce contact resistance.

In FIG. 1, the metal films 17 are formed on the plug layers 12 formed of polysilicon. However, in the embodiment of the present disclosure, portions near interfaces of the metal films 17 with the plug layers 12 may react with the plug layers 12 formed of polysilicon to be silicided. In this case, as in the case explained above, the contact resistance with the plug layers 12 can be sufficiently reduced by the silicide.

The memory storage device according to this embodiment can be manufactured, for example, as explained below.

Figure 2A:
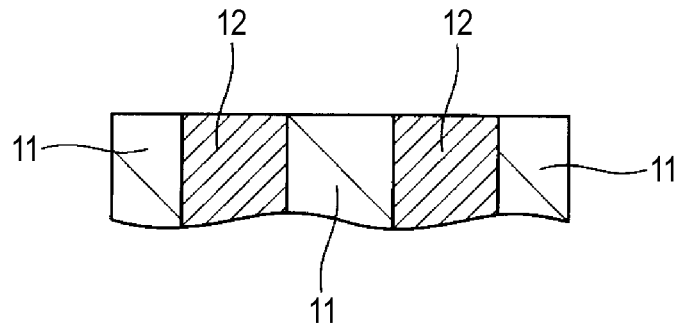
FIGS. 2A to 2D are manufacturing process charts for explaining a method of manufacturing the memory storage device shown in FIG. 1.

First, as shown in FIG. 2A, the plug layers 12 are formed of polysilicon in the insulating layer 11.

Thereafter, the interlayer insulating layer 16 for separating the lower electrodes 13 to be formed later is formed to cover the surface. As a material of the interlayer insulating layer 16, in general, $SiO_2$, SiN, or the like is used.

Figure 2B:
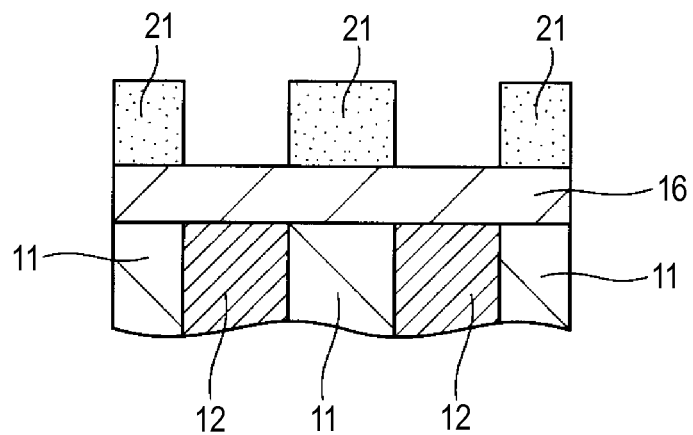

Subsequently, a resist 21 is applied on the surface of the interlayer insulating layer 16. Lithography is applied to the resist 21, whereby, as shown in FIG. 2B, patterns for the lower electrodes 13 are opened on the plug layers 12.

Figure 2C:
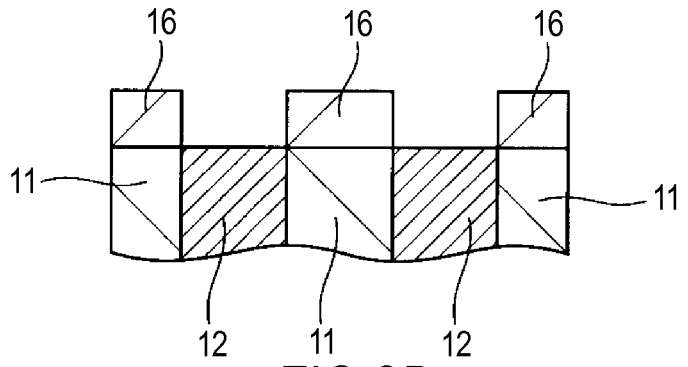

A dry etching step for the interlayer insulating layer 16 and a removing step for the resist 21 are performed, whereby, as shown in FIG. 2C, connection holes for embedded the lower electrodes 13 are formed on the plug layers 12.

Figure 2D:
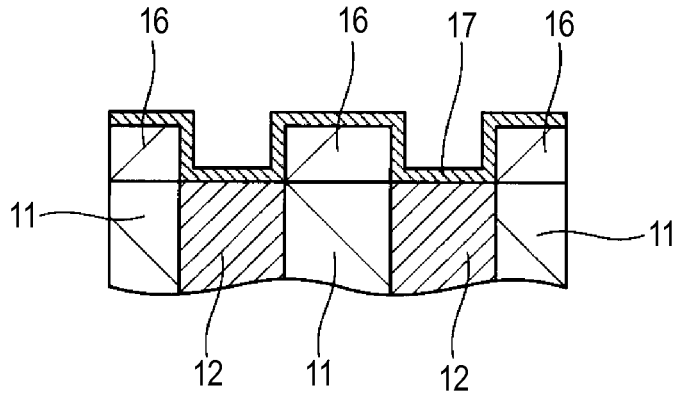

As shown in FIG. 2D, the metal film 17, for example, a film formed of one or more kinds of metal selected out of Ti, Co, Ni, W, and Ta such as a Ti film is formed on the surface in thickness smaller than the depth of the connection holes among the interlayer insulating layers 16. Consequently, in the connection holes, the metal film 17 is formed along the bottom surfaces and the sidewall surfaces of the connection holes and formed in contact with the plug layers 12.

Figure 3E:
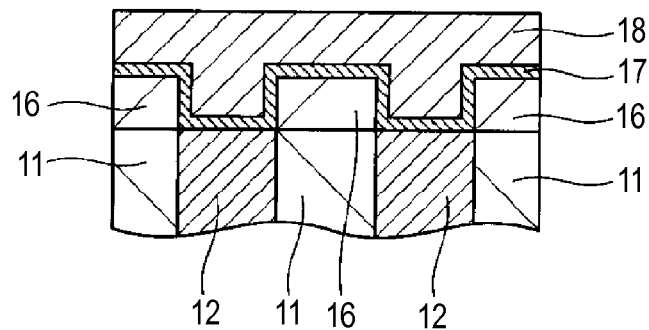
FIGS. 3E to 3H are manufacturing process charts for explaining the method of manufacturing the memory storage device shown in FIG. 1.

As shown in FIG. 3E, the metal nitride layer 18, for example, a TiN layer is formed on the surface in thickness for completely filling the connection holes. Consequently, the metal nitride layer 18 is formed to fill spaces on the metal film 17 in the connection holes.

Figure 3F:
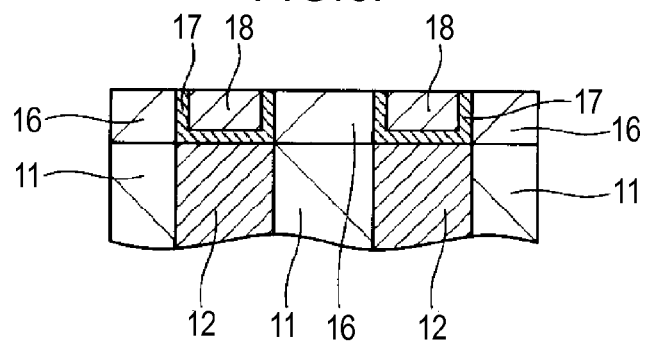
Figure 3G:
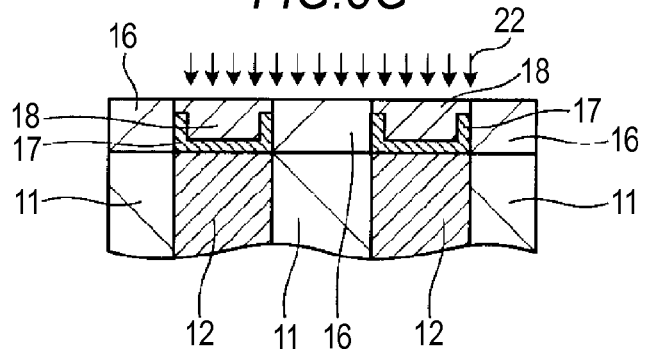
Figure 3H:
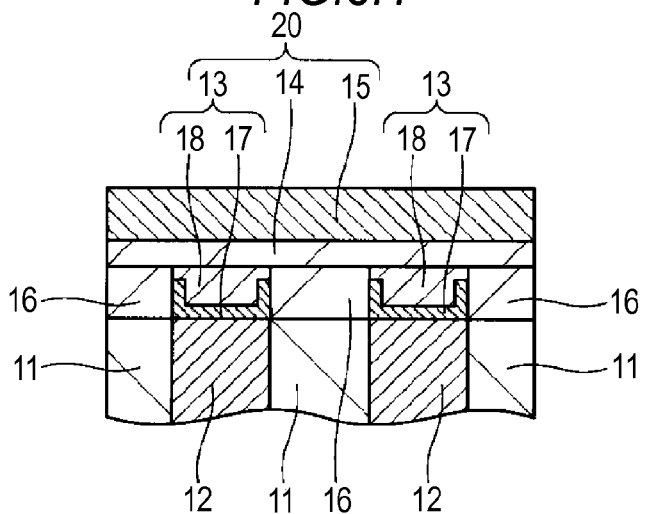

The surface is planarized by the CMP (chemical mechanical polishing) method. Consequently, as shown in FIG. 3F, the metal films 17 and the metal nitride layers 18 on the interlayer insulating layers 16 are removed and the metal film 17 and the metal nitride layers 18 remain only in the connection holes on the plug layers 12.

The metal films 17 in portions near the surface are nitrided by nitride plasma treatment 22 and changed to the metal oxide layers 18. Consequently, the metal films 17 formed of pure metal are not exposed to the surface.

It is also possible to nitride the metal films 17 near the surface by performing heat treatment in a hot nitride atmosphere instead of the nitride plasma treatment 22.

In this case, time for the heat treatment is set to relative short time to prevent most of the metal films 17 from being nitrided.

Subsequently, the memory storage layer 14 and the upper electrode 15 are sequentially formed and the memory storage elements 20 including the lower electrodes 13, the memory storage layer 14, and the upper electrode 15 are formed. Consequently, only the metal nitride layers 18 in the lower electrodes 13 are in contact with the memory storage layer 14.

Thereafter, according to necessity, components such as an insulating layer that covers and protects the surface and wires connected to the upper electrode 15 are formed.

In this way, the memory storage device shown in FIG. 1 can be manufactured.

With the configuration of the memory storage device according to this embodiment, since the metal films 17 are in contact with interfaces with the plug layers 12 formed of polysilicon in the lower electrodes 13 of the memory storage elements 20, contact resistance with the plug layers 12 decreases. Consequently, it is possible to apply desired current and voltage to the memory cells.

Even when the metal films 17 in portions in contact with the plug layers 12 are finally silicided by heat treatment, since silicide layers are in contact with the interfaces with the plug layers 12, the contact resistance decreases.

Since only the metal nitride layers 18 in the lower electrodes 13 are in contact with the memory storage layer 14, intrusion of metal such as Ti into the memory storage layer 14 is suppressed. Consequently, it is possible to obtain a satisfactory switching characteristic in the memory storage elements 20 of the memory cells.

Therefore, according to this embodiment, since desired current and voltage can be applied to the memory cells and a satisfactory switching characteristic can be obtained, it is possible to accurately and stably perform recording of information in the memory cells and realize a highly reliable memory storage device.

<2. Second Embodiment>

Figure 4:
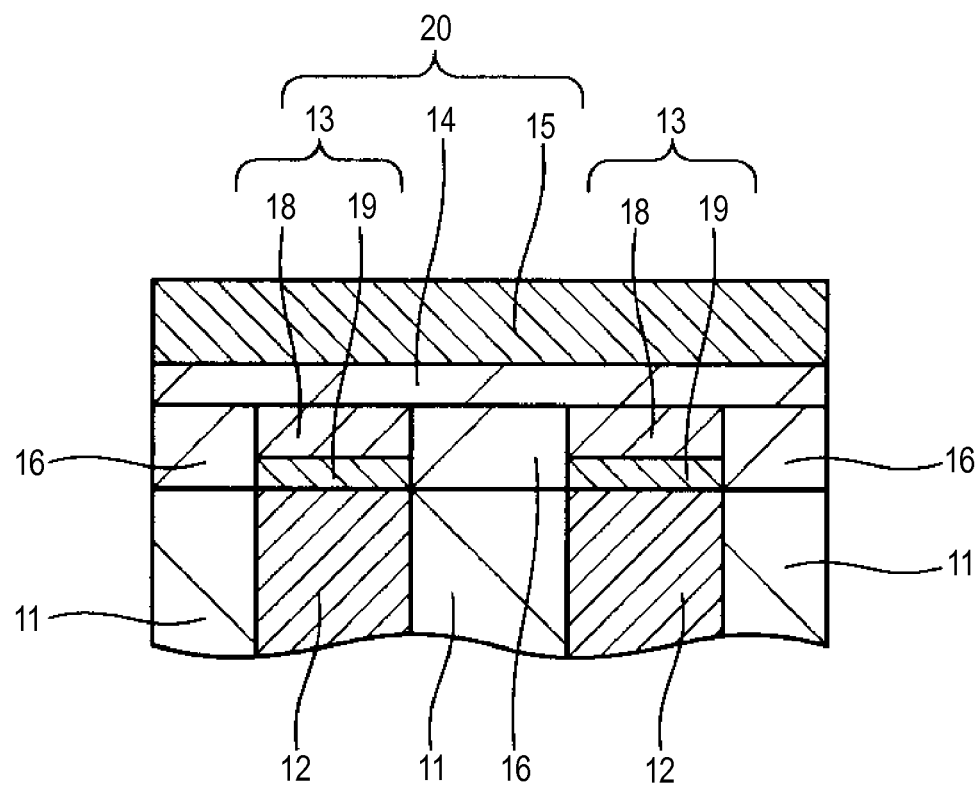
FIG. 4 is a schematic diagram (sectional view) of a memory storage device according to a second embodiment of the present disclosure.

A schematic diagram (sectional view) of a memory storage device according to a second embodiment of the present disclosure is shown in FIG. 4.

In this embodiment, as shown in FIG. 4, silicide layers (metal silicide layers, hereinafter referred to as "silicide layer") 19 are formed between the metal nitride layers 18 and the plug layers 12 formed of polysilicon.

The lower electrodes 13 of the memory storage elements 20 are formed by lamination of the silicide layers 19, which are first layers, and the metal nitride layers 18, which are second layers.

Consequently, since only the silicide layers 19 in the lower electrodes 13 are in contact with the plug layers 12 formed of polysilicon, contact resistance decreases.

Since only the metal nitride layers 18 in the lower electrodes 13 are in contact with the memory storage layer 14, it is possible to suppress intrusion of metal such as Ti into the memory storage layer 14.

The other components are the same as those in the first embodiment shown in FIG. 1. Therefore, the components are denoted by the same reference numerals and signs and redundant explanation of the components is omitted.

As a material of the silicide layers 19, a metal silicide of TiSi, CoSi, WSi, TaSi, or the like can be used.

The memory storage device according to this embodiment can be manufactured, for example, as explained below.

First, steps same as those shown in FIGS. 2A to 2D in the first embodiment are performed. Specifically, in the connection holes, the metal film 17, for example, a film formed of one or more kinds of metal selected out of Ti, Co, Ni, W, and Ta such as a Ti film is formed along the bottom surfaces and the sidewall surfaces of the connection holes and in contact with the plug layers 12.

Figure 5E:
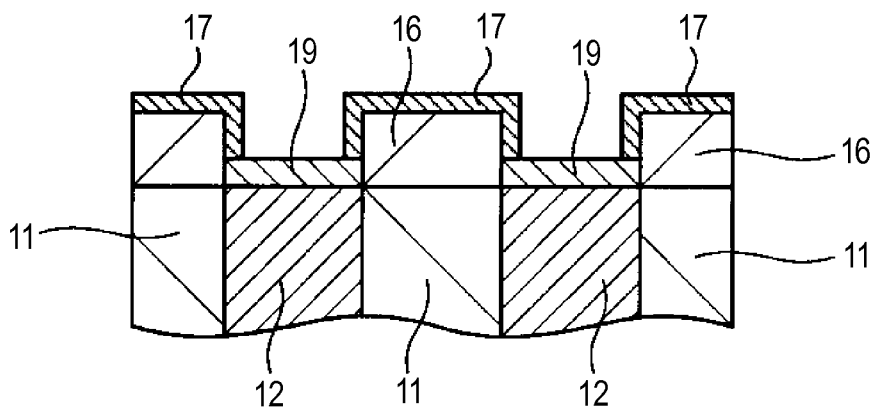
FIGS. 5E to 5G are manufacturing process charts for explaining a method of manufacturing the memory storage device shown in FIG. 4.

Subsequently, portions in contact with the plug layers 12 formed of polysilicon in the metal film 17 are selectively silicided by performing annealing. Conditions for the annealing are, for example, 700° C. and 10 seconds. Consequently, as shown in FIG. 5E, the silicide layers 19 are formed in the portions in contact with the plug layers 12. The metal films 17 in other portions do not change because the metal films 17 do not react with the plug layers 12.

Figure 5F:
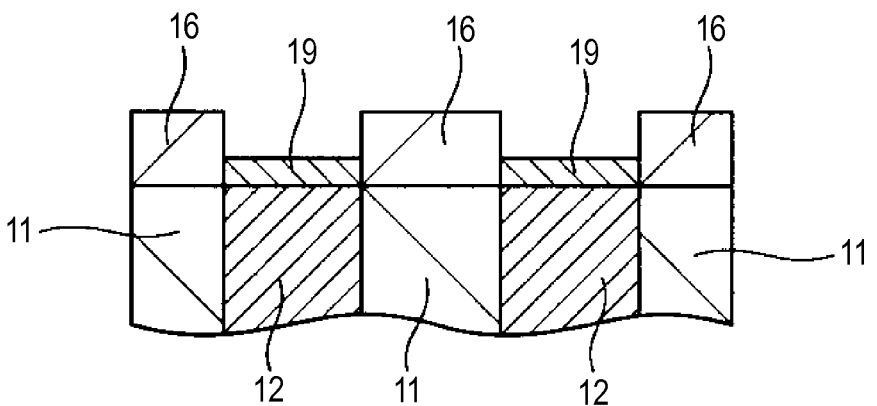

The metal films 17 not reacting with the plug layers 12 are selectively removed by wet treatment. Consequently, as shown in FIG. 5F, the silicide layers 19 formed only in the portions in contact with the plug layers 12 in the connection holes remain.

Figure 5G:
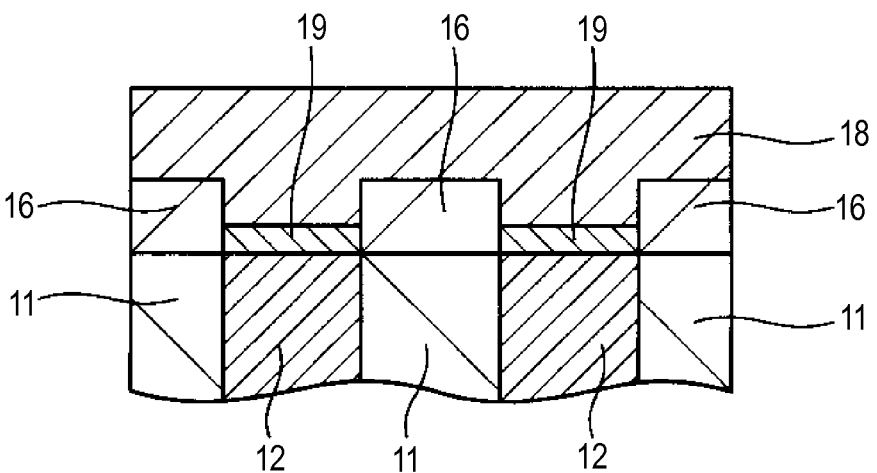

As shown in FIG. 5G, the metal nitride layer 18, for example, a TiN layer is formed on the surface in thickness for completely filling the connection holes. Consequently, the metal nitride layer 18 is formed to fill spaces on the metal silicide layers 19 in the connection holes.

Figure 6H:
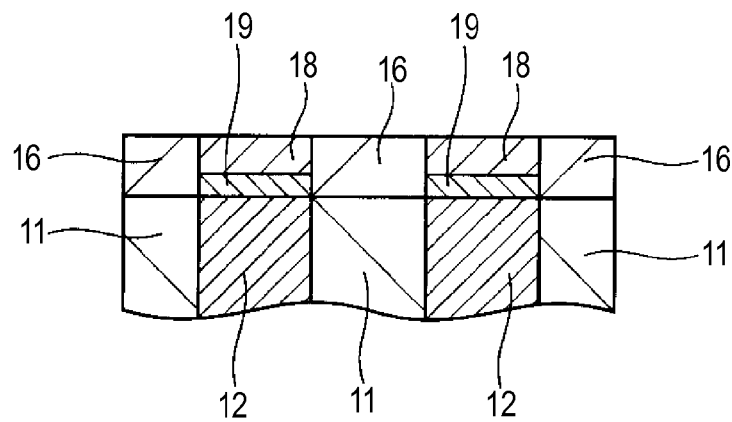
FIGS. 6H and 6I are manufacturing process charts for explaining the method of manufacturing the memory storage device shown in FIG. 4.

The surface is planarized by the CMP method. Consequently, as shown in FIG. 6H, the metal nitride layer 18 on the interlayer insulating layers 16 is removed and the silicide layers 19 and the metal nitride layers 18 remain only in the connection holes on the plug layers 12.

Figure 6I:
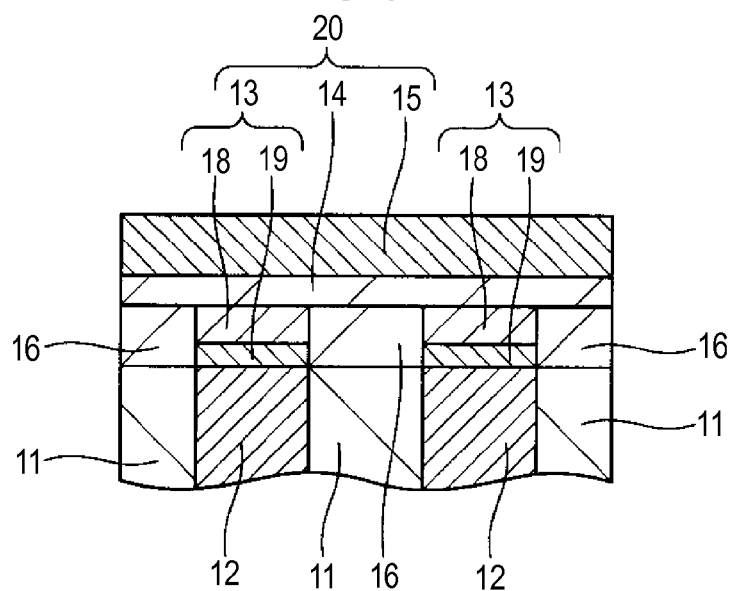

Subsequently, the memory storage layer 14 and the upper electrode 15 are sequentially formed. As shown in FIG. 6I, the memory storage elements 20 including the lower electrodes 13, the memory storage layer 14, and the upper electrode 15 are formed. Consequently, only the metal nitride layers 18 in the lower electrodes 13 are in contact with the memory storage layer 14.

Thereafter, according to necessity, components such as an insulating layer that covers and protects the surface and wires connected to the upper electrode 15 are formed.

In this way, the memory storage device shown in FIG. 4 can be manufactured.

The manufacturing method according to this embodiment does not include the step of nitriding the metal film 17 with the nitride plasma treatment explained in the manufacturing method according to the first embodiment.

Therefore, in this embodiment, a nitride of metal different from the metal of the metal film 17 can also be used in the metal nitride layers 18.

With the configuration of the memory storage device according to this embodiment, since only the silicide layers 19 are in contact with interfaces with the plug layers 12 formed of polysilicon in the lower electrodes 13 of the memory storage elements 20, contact resistance with the plug layers 12 decreases. Consequently, it is possible to apply desired current and voltage to the memory cells.

Since only the metal nitride layers 18 in the lower electrodes 13 are in contact with the memory storage layer 14, intrusion of metal such as Ti into the memory storage layer 14 is suppressed. Consequently, it is possible to obtain a satisfactory switching characteristic in the memory storage elements 20 of the memory cells.

Therefore, according to this embodiment, since desired current and voltage can be applied to the memory cells and a satisfactory switching characteristic can be obtained, it is possible to accurately and stably perform recording of information in the memory cells and realize a highly reliable memory storage device.

<3. Third Embodiment>

Figure 7:
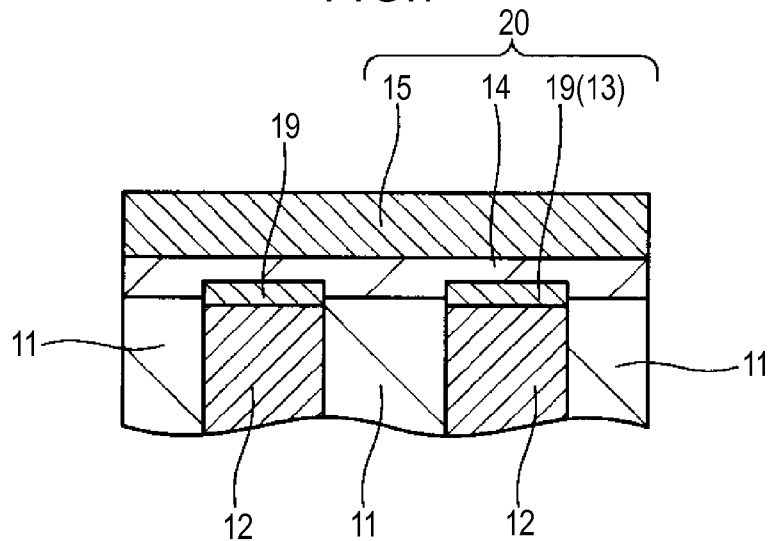
FIG. 7 is a schematic diagram (sectional view) of a memory storage device according to a third embodiment of the present disclosure.

A schematic diagram (sectional view) of a memory storage device according to a third embodiment of the present disclosure is shown in FIG. 7.

In this embodiment, as shown in FIG. 7, the silicide layers 19 are formed near the interfaces with the plug layers 12 formed of polysilicon. The memory storage layer 14 is formed on the silicide layers 19. The lower electrodes 13 of the memory storage elements 20 include the silicide layers 19.

Consequently, since the silicide layers 19 of the lower electrodes 13 are in contact with the plug layers 12 formed of polysilicon, contact resistance decreases.

Since only the silicide layers 19 of the lower electrodes 13 are in contact with the memory storage layer 14, it is possible to suppress intrusion of metal such as Ti into the memory storage layer 14.

The other components are the same as those in the first embodiment shown in FIG. 1. Therefore, the components are denoted by the same reference numerals and signs and redundant explanation of the components is omitted.

In this embodiment, as in the second embodiment, as a material of the silicide layers 19, a metal silicide of TiSi, CoSi, WSi, TaSi, or the like can be used.

The memory storage device according to this embodiment can be manufactured, for example, as explained below.

Figure 8A:
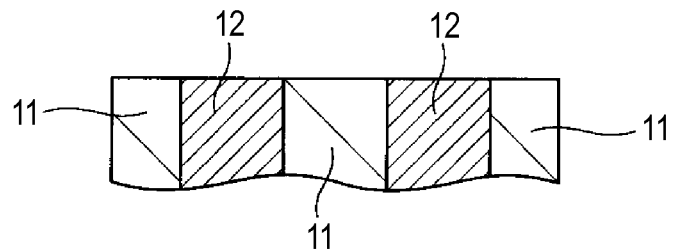
FIGS. 8A to 8E are manufacturing process charts for explaining a method of manufacturing the memory storage device shown in FIG. 7.

First, as shown in FIG. 8A, the plug layers 12 are formed of polysilicon in the insulating layer 11.

Figure 8B:
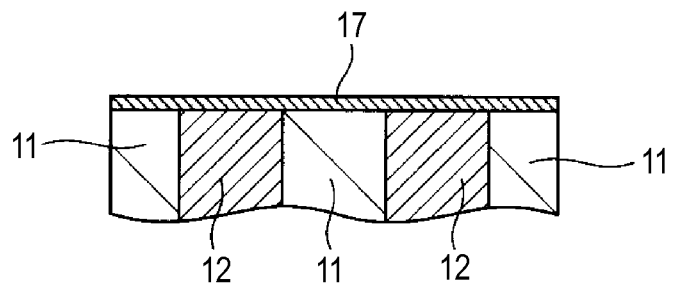

Subsequently, as shown in FIG. 8B, the metal film 17, for example, a film formed of one or more kinds of metal selected out of Ti, Co, Ni, W, and Ta such as a Ti film is formed on the surface. Consequently, the metal film 17 is formed in contact with the plug layers 12.

Figure 8C:
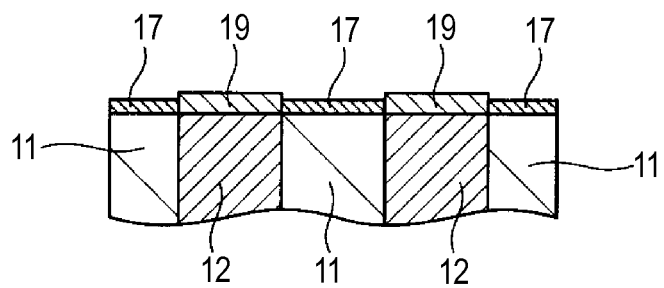

Portions in contact with the plug layers 12 formed of polysilicon in the metal film 17 are selectively silicided by performing annealing. Conditions for the annealing are, for example, 700° C. and 10 seconds. Consequently, as shown in FIG. 8C, the silicide layers 19 are formed in the portions in contact with the plug layers 12 in self-alignment with the plug layers 12. The metal films 17 in other portions do not change because the metal films 17 do not react with the plug layers 12.

Figure 8D:
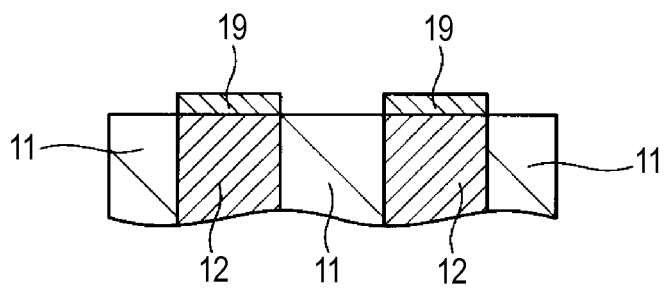
Figure 8E:
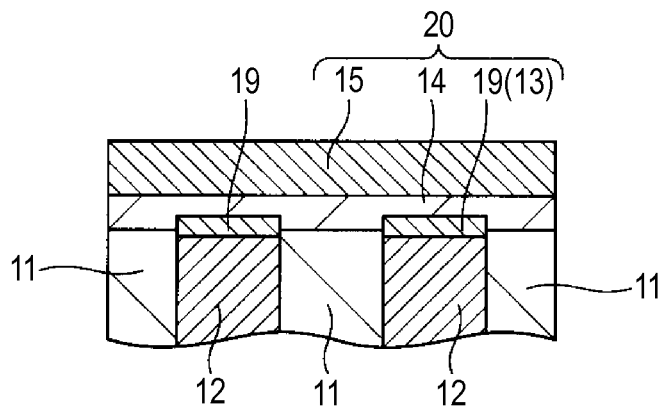

The metal films 17 not reacting with the plug layers 12 are selectively removed by wet treatment. Consequently, as shown in FIG. 8D, the silicide layers 19 formed only in the portions in contact with the plug layers 12 remain. On the surface, only the insulating layer 11 and the silicide layers 19 are exposed and pure metal is not exposed.

Subsequently, the memory storage layer 14 and the upper electrode 15 are sequentially formed and the memory storage elements 20 including the lower electrodes 13, the memory storage layer 14, and the upper electrode 15 are formed. Consequently, the silicide layers 19 of the lower electrodes 13 are in contact with the memory storage layer 14.

Thereafter, according to necessity, components such as an insulating layer that covers and protects the surface and wires connected to the upper electrode 15 are formed.

In this way, the memory storage device shown in FIG. 7 can be manufactured.

With the configuration of the memory storage device according to this embodiment, since the silicide films 19 of the lower electrodes 13 are in contact with interfaces with the plug layers 12 formed of polysilicon, contact resistance with the plug layers 12 decreases. Consequently, it is possible to apply desired current and voltage to the memory cells.

Since only the silicide layers 19 of the lower electrodes 13 are in contact with the memory storage layer 14, intrusion of metal such as Ti into the memory storage layer 14 is suppressed. Consequently, it is possible to obtain a satisfactory switching characteristic in the memory storage elements 20 of the memory cells.

Therefore, according to this embodiment, desired current and voltage can be applied to the memory cells and a satisfactory switching characteristic can be obtained. Therefore, it is possible to accurately and stably perform recording of information in the memory cells and realize a highly reliable memory storage device.

<4. Fourth Embodiment>

Figure 9:
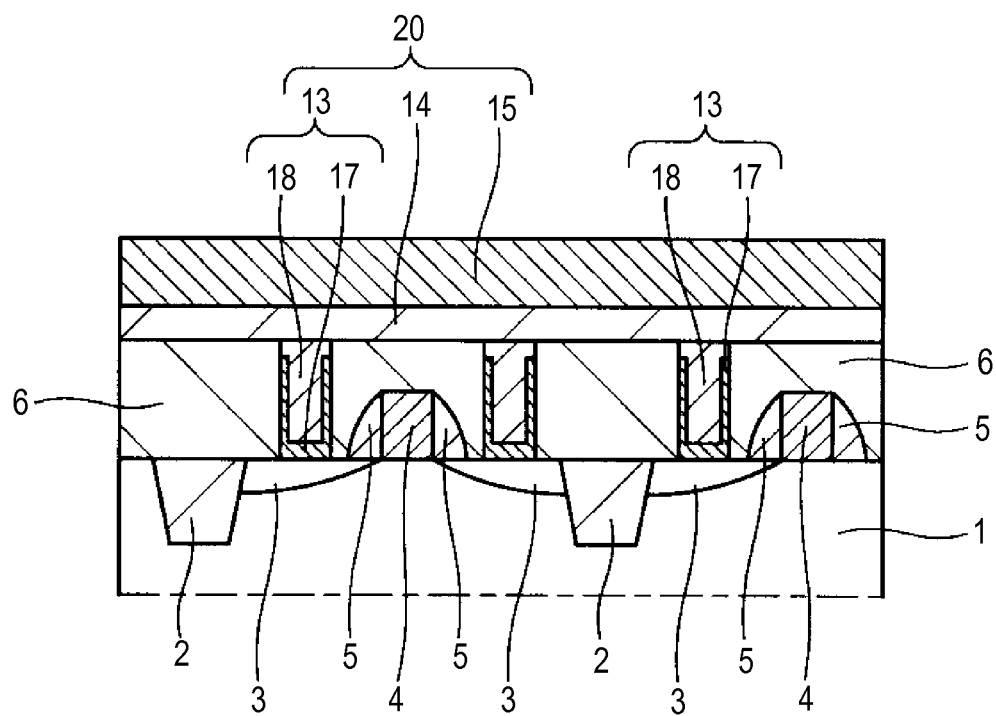
FIG. 9 is a schematic diagram (sectional view) of a memory storage device according to a fourth embodiment of the present disclosure.

A schematic diagram (sectional view) of a memory storage device according to a fourth embodiment of the present disclosure is shown in FIG. 9.

In this embodiment, as shown in FIG. 9, the configuration of the portions of the memory storage elements 20 is the same as the configuration in the first embodiment shown in FIG. 1. Further, the lower electrodes 13 are directly connected to source/drain regions 3 of MOS transistors formed on a silicon substrate 1 rather than via plug layers.

In the silicon substrate 1, device isolation layers 2 including insulating layers and provided for isolating devices are formed near the surface of the silicon substrate 1. The MOS transistors are formed in the silicon substrate 1 in portions isolated by the device isolation layers 2.

The MOS transistors include the source/drain regions 3 formed in the silicon substrate 1, gate electrodes 4 formed on the silicon substrate 1, and not-shown gate insulating films formed between the silicon substrate 1 and the gate electrodes 4.

Sidewalls 5 including insulating layers are formed on the sidewalls of the gate electrodes 4 of the MOS transistors. An interlayer insulating layer 6 is formed to cover the gate electrodes 4 and the sidewalls 5.

The lower electrodes 13 of the memory storage elements 20 are formed to be embedded in the interlayer insulating layer 6. As in the first embodiment shown in FIG. 1, the lower electrodes 13 include the metal films 17 and the metal nitride layers 18. The metal films 17 of the lower electrodes 13 are formed in contact with the source/drain regions 3 of the MOS transistors. The lower electrodes 13 and the source/drain regions 3 are electrically connected.

Consequently, since only the metal films 17 in the lower electrodes 13 are in contact with interfaces with the silicon substrate 1, contact resistance decreases.

Since only the metal nitride layers 18 in the lower electrodes 13 are in contact with the memory storage layer 14, it is possible to suppress intrusion of metal such as Ti into the memory storage layer 14.

The memory storage device according to this embodiment can be manufactured, for example, as explained below.

First, the device isolation layers 2, the gate electrodes 4 and the source/drain regions 3 of the MOS transistors, and the sidewalls 5 on the sidewalls of the gate electrodes 4 are formed in the silicon substrate 1 in advance.

Figure 10A:
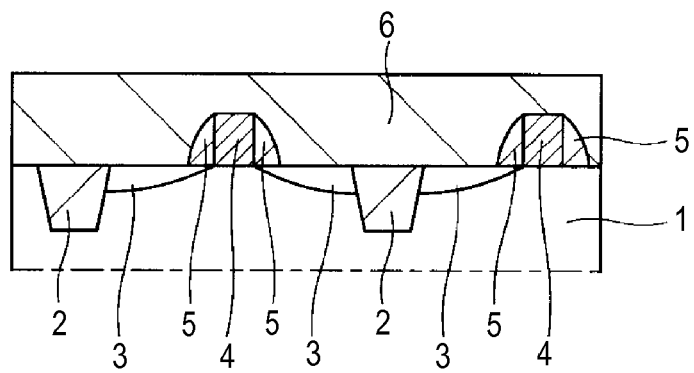
FIGS. 10A to 10D are manufacturing process charts for explaining a method of manufacturing the memory storage device shown in FIG. 9.

Subsequently, as shown in FIG. 10A, the interlayer insulating layer 6 is formed of $SiO_2$ or the like to cover the surface.

Thereafter, a resist is applied to the interlayer insulating layer 6. Lithography is applied to the resist, whereby patterns for node contacts (the lower electrodes 13) are opened in the interlayer insulating layer 6.

Figure 10B:
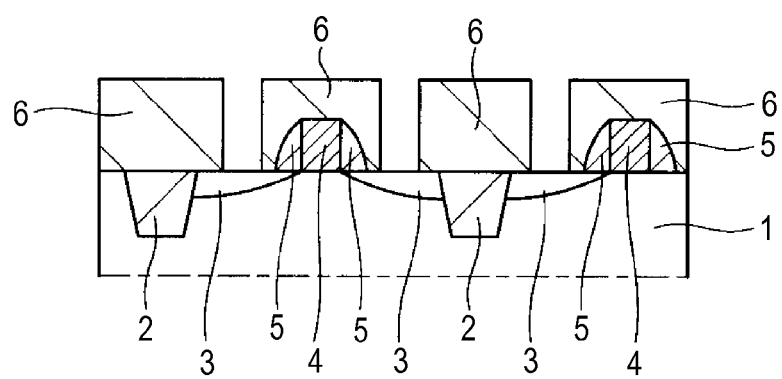

A dry etching step for the interlayer insulating layer 6 and a removing step for the resist are performed, whereby as shown in FIG. 10B, connection holes for embedding the lower electrodes 13 are formed on the source/drain regions 3 of the MOS transistors.

Figure 10C:
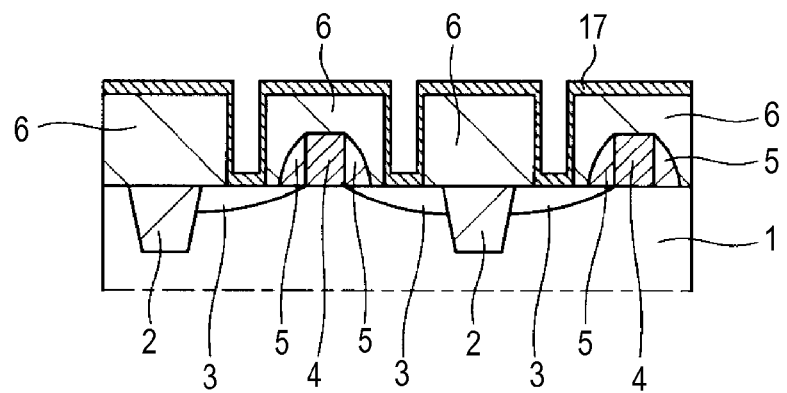

As shown in FIG. 10C, the metal film 17, for example, a film formed of one or more kinds of metal selected out of Ti, Co, Ni, W, and Ta such as a Ti film is formed on the surface in thickness smaller than the depth of the connection holes among the interlayer insulating layers 6. Consequently, in the connection holes, the metal film 17 is formed along the bottom surfaces and the sidewall surfaces of the connection holes and formed in contact with the source/drain regions 3 of the MOS transistors.

Figure 10D:
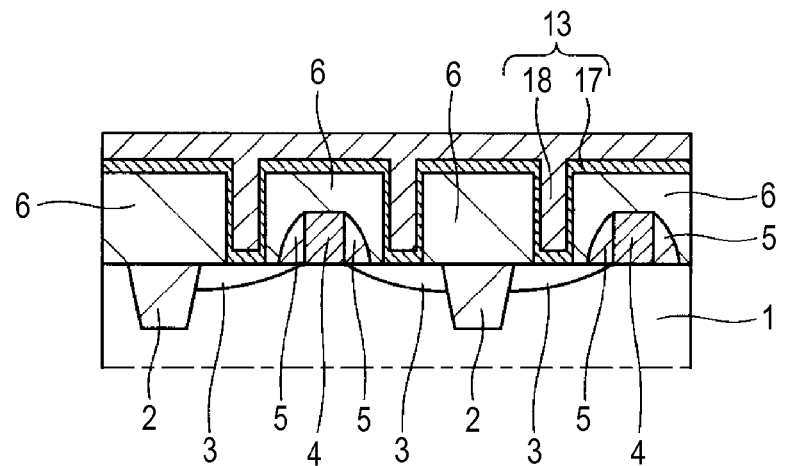

As shown in FIG. 10D, the metal nitride layer 18, for example, a TiN layer is formed on the surface in thickness for completely filling the connection holes. Consequently, the metal nitride layers 18 are formed to fill spaces on the metal film 17 in the connection holes.

The surface is planarized by the CMP method. Consequently, as shown in FIG. 11E, the metal film 17 and the metal nitride layer 18 on the interlayer insulating layers 6 are removed and the metal film 17 and the metal nitride layer 18 remain only in the connection holes on the source/drain regions 3 of the MOS transistors.

Figure 11E:
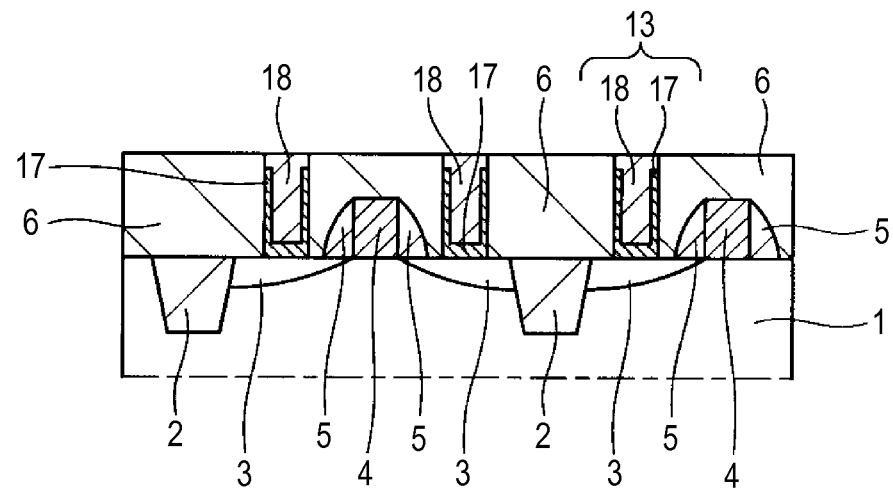
FIGS. 11E to 11G are manufacturing process charts for explaining the method of manufacturing the memory storage device shown in FIG. 9.
Figure 11F:
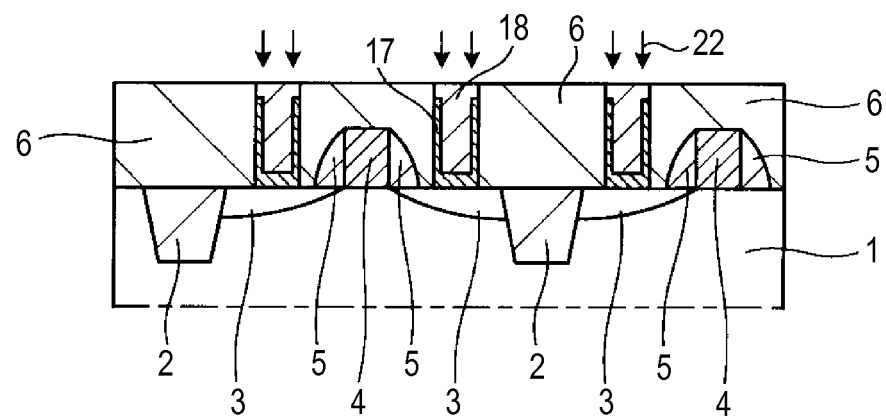
Figure 11G:
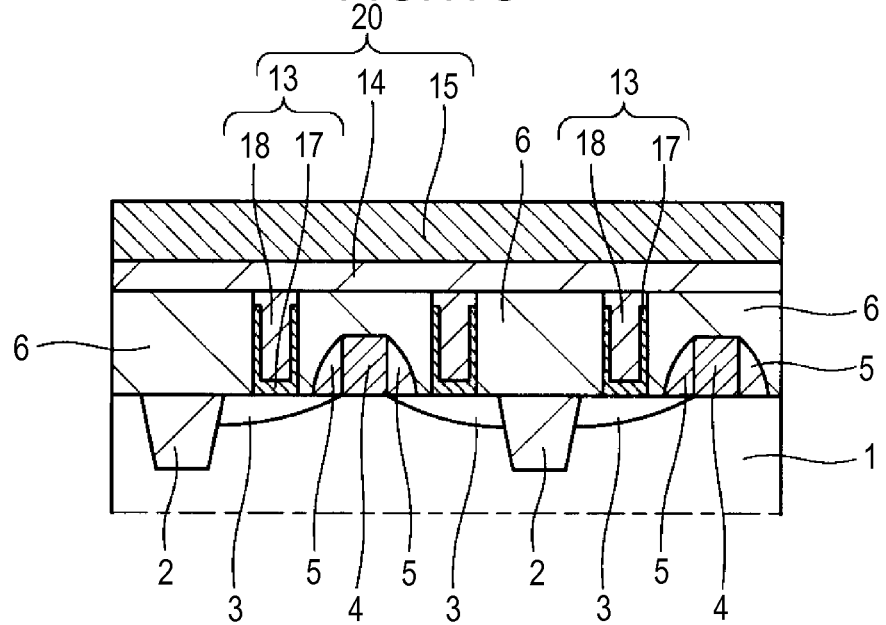

The metal films 17 in portions near the surface are nitrided by the nitride plasma treatment 22 and changed to the metal oxide layers 18 as shown in FIG. 11F. Consequently, the metal films 17 formed of pure metal are not exposed to the surface.

As in the first embodiment, it is also possible to nitride the metal films 17 near the surface by performing heat treatment in a hot nitride atmosphere instead of the nitride plasma treatment 22.

Subsequently, the memory storage layer 14 and the upper electrode 15 are sequentially formed and the memory storage elements 20 including the lower electrodes 13, the memory storage layer 14, and the upper electrode 15 are formed as shown in FIG. 11E. Consequently, only the metal nitride layers 18 in the lower electrodes 13 are in contact with the memory storage layer 14.

Thereafter, according to necessity, components such as an insulating layer that covers and protects the surface and wires connected to the upper electrode 15 are formed.

In this way, the memory storage device shown in FIG. 9 can be manufactured.

With the configuration of the memory storage device according to this embodiment, since the metal films 17 are in contact with interfaces with the source/drain regions 3 of the MOS transistors in the lower electrodes 13 of the memory storage elements 20, contact resistance with the source/drain regions 3 decreases. Consequently, it is possible to apply desired current and voltage to the memory cells.

Even when the metal films 17 in portions in contact with the source/drain regions 3 are finally silicided by heat treatment, since silicide layers are in contact with the interfaces with the source/drain regions 3, the contact resistance decreases.

Since only the metal nitride layers 18 in the lower electrodes 13 are in contact with the memory storage layer 14, intrusion of metal such as Ti into the memory storage layer 14 is suppressed. Consequently, it is possible to obtain a satisfactory switching characteristic in the memory storage elements 20 of the memory cells.

Therefore, according to this embodiment, since desired current and voltage can be applied to the memory cells and a satisfactory switching characteristic can be obtained, it is possible to accurately and stably perform recording of information in the memory cells and realize a highly reliable memory storage device.

<5. Fifth Embodiment>

Figure 12:
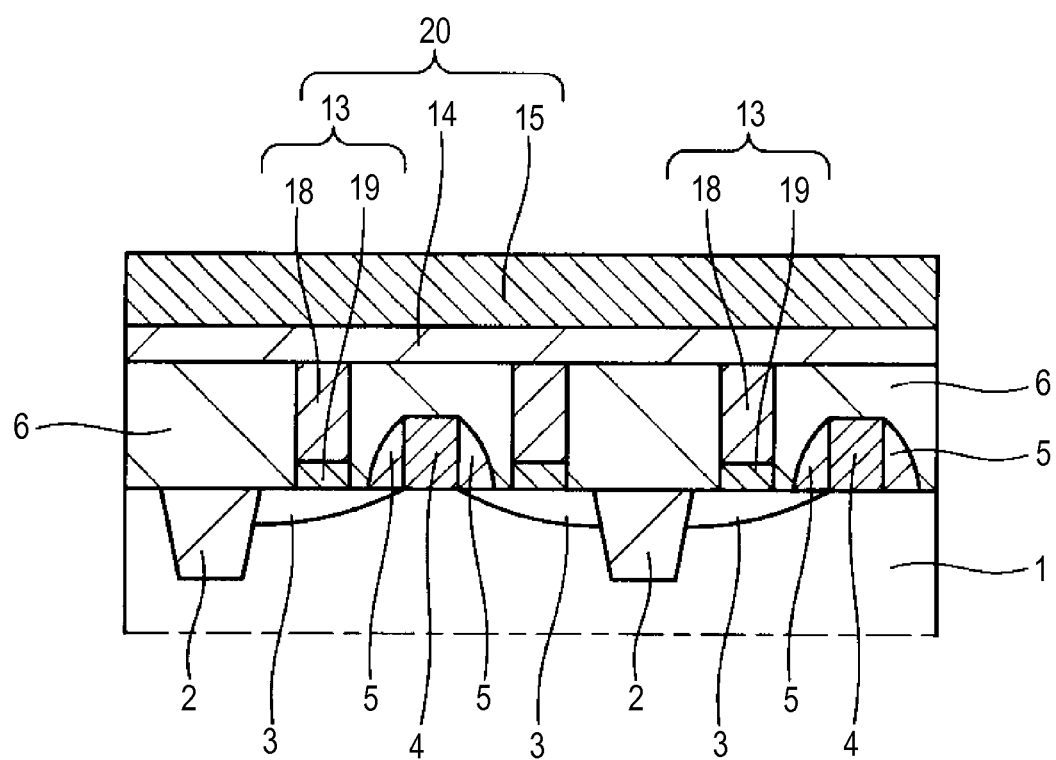
FIG. 12 is a schematic diagram (sectional view) of a memory storage device according to a fifth embodiment of the present disclosure.

A schematic diagram (sectional view) of a memory storage device according to a fifth embodiment of the present disclosure is shown in FIG. 12.

In this embodiment, as shown in FIG. 12, the configuration of the portions of the memory storage elements 20 is the same as the configuration in the second embodiment shown in FIG. 4. Further, the lower electrodes 13 are directly connected to the source/drain regions 3 of the MOS transistors formed on the silicon substrate 1 rather than via plug layers.

The lower electrodes 13 of the memory storage elements 20 are formed to be embedded in the interlayer insulating layer 6 formed to cover the gate electrodes 4 and the sidewalls 5 of the MOS transistors. As in the second embodiment shown in FIG. 4, the lower electrodes 13 include the silicide layers 19, which are the first layers, and the metal nitride layers 18, which are the second layers. The silicide layers 19 of the lower electrodes 13 are formed in contact with the source/drain regions 3 of the MOS transistors. The lower electrodes 13 and the source/drain regions 3 are electrically connected.

Consequently, since only the silicide layers 19 in the lower electrodes 13 are in contact with interfaces with the source/drain regions 3, contact resistance decreases.

Since only the metal nitride layers 18 in the lower electrodes 13 are in contact with the memory storage layer 14, it is possible to suppress intrusion of metal such as Ti into the memory storage layer 14.

The other components are the same as those in the fourth embodiment shown in FIG. 9 and the second embodiment shown in FIG. 4. Therefore, the components are denoted by the same reference numerals and signs and redundant explanation of the components is omitted.

In this embodiment, as in the second embodiment, as a material of the silicide layers 19, a metal silicide of TiSi, CoSi, WSi, TaSi, or the like can be used.

The memory storage device according to this embodiment can be manufactured, for example, as explained below.

First, the device isolation layers 2, the gate electrodes 4 and the source/drain regions 3 of the MOS transistors, and the sidewalls 5 on the sidewalls of the gate electrodes 4 are formed in the silicon substrate 1 in advance.

Figure 13A:
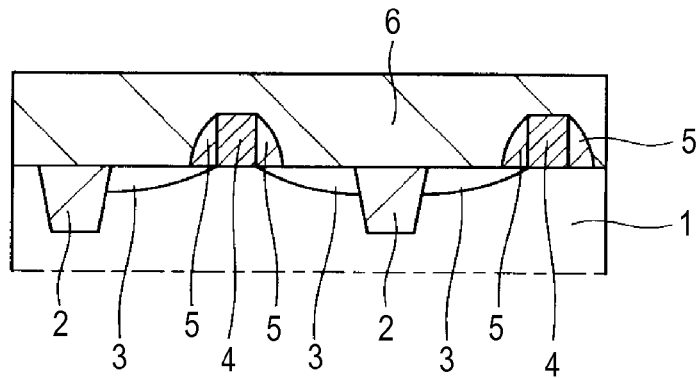
FIGS. 13A to 13D are manufacturing process charts for explaining a method of manufacturing the memory storage device shown in FIG. 12.

Subsequently, as shown in FIG. 13A, the interlayer insulating layer 6 is formed of $SiO_2$ or the like to cover the surface.

Thereafter, a resist is applied to the interlayer insulating layer 6. Lithography is applied to the resist, whereby patterns for node contacts (the lower electrodes 13) are opened in the interlayer insulating layer 6.

Figure 13B:
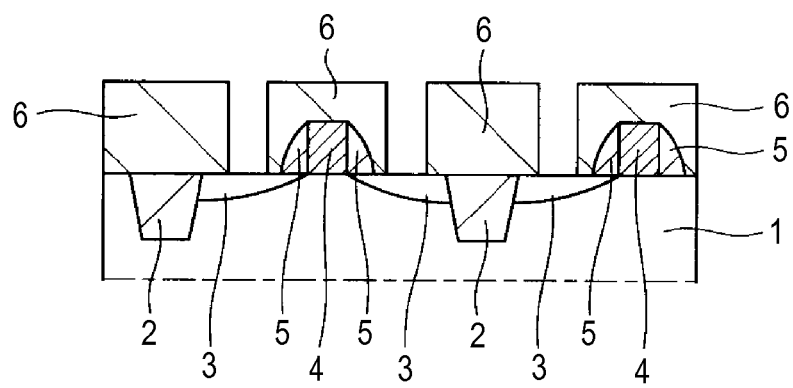

A dry etching step for the interlayer insulating layer 6 and a removing step for the resist are performed, whereby as shown in FIG. 13B, connection holes for embedding the lower electrodes are formed on the source/drain regions 3 of the MOS transistors.

Figure 13C:
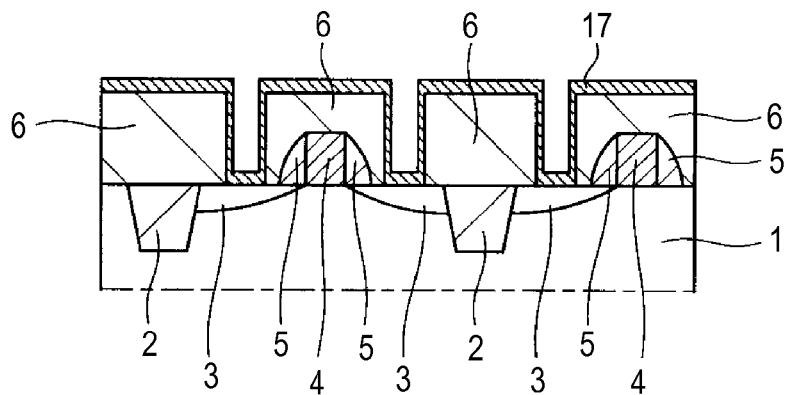

As shown in FIG. 13C, the metal film 17, for example, a film formed of one or more kinds of metal selected out of Ti, Co, Ni, W, and Ta such as a Ti film is formed on the surface in thickness smaller than the depth of the connection holes among the interlayer insulating layers 6. Consequently, in the connection holes, the metal film 17 is formed along the bottom surfaces and the sidewall surfaces of the connection holes and formed in contact with the source/drain regions 3 of the MOS transistors.

Figure 13D:
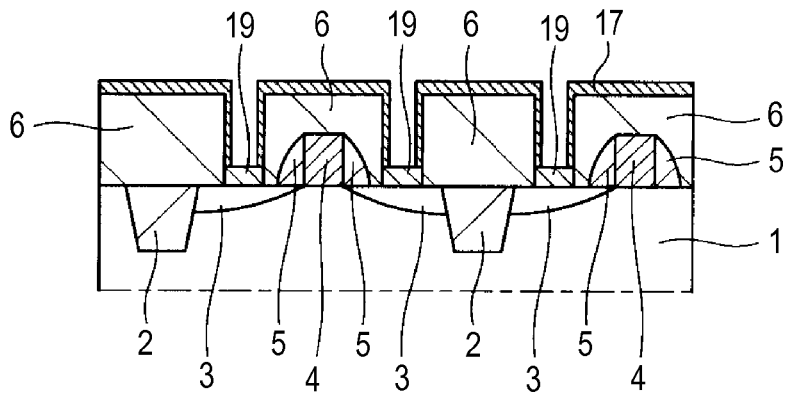

Subsequently, portions in contact with the silicon substrate 1 (the source/drain regions 3) in the metal film 17 are selectively silicided by performing annealing. Conditions for the annealing are, for example, 700° C. and 10 seconds. Consequently, as shown in FIG. 13D, the silicide layers 19 are formed in the portions in contact with the silicon substrate 1 (the source/drain regions 3). The metal films 17 in other portions do not change because the metal films 17 do not react with the silicon substrate 1 (the source/drain regions 3).

Figure 14E:
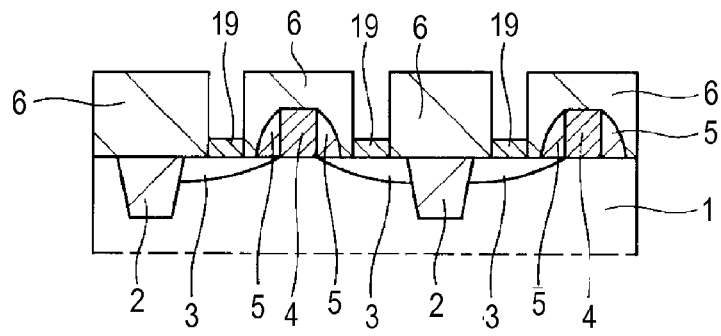
FIGS. 14E to 14H are manufacturing process charts for explaining the method of manufacturing the memory storage device shown in FIG. 12.

The metal films 17 not reacting with the silicon substrate 1 (the source/drain regions 3) are selectively removed by wet treatment. Consequently, as shown in FIG. 14E, the silicide layers 19 formed only in the portions in contact with the silicon substrate 1 (the source/drain regions 3) in the connection holes remain.

Figure 14F:
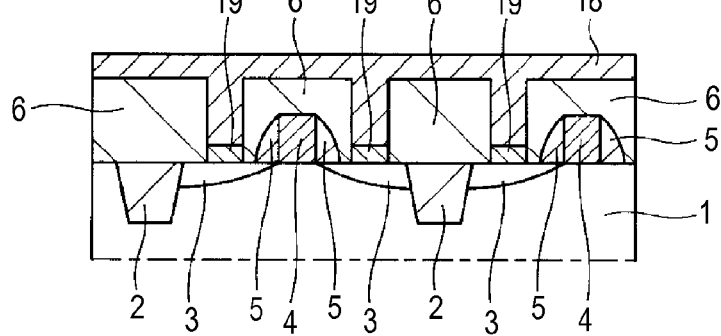

As shown in FIG. 14F, the metal nitride layer 18, for example, a TiN layer is formed on the surface in thickness for completely filling the connection holes. Consequently, the metal nitride layer 18 is formed to fill spaces on the metal silicide layers 19 in the connection holes.

Figure 14G:
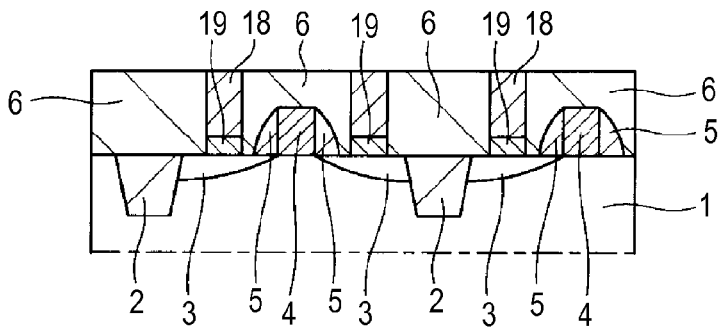

The surface is planarized by the CMP method. Consequently, as shown in FIG. 14G, the metal nitride layer 18 on the interlayer insulating layers 6 is removed and the silicide layers 19 and the metal nitride layers 18 remain only in the connection holes on the source/drain regions 3.

Figure 14H:
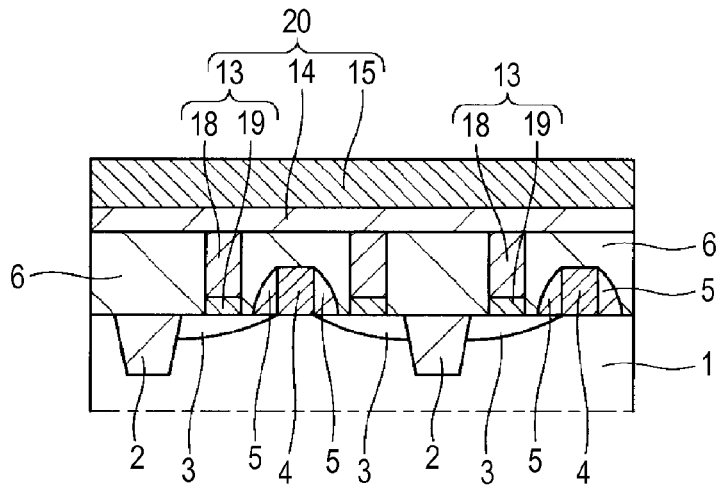
Figure 15:
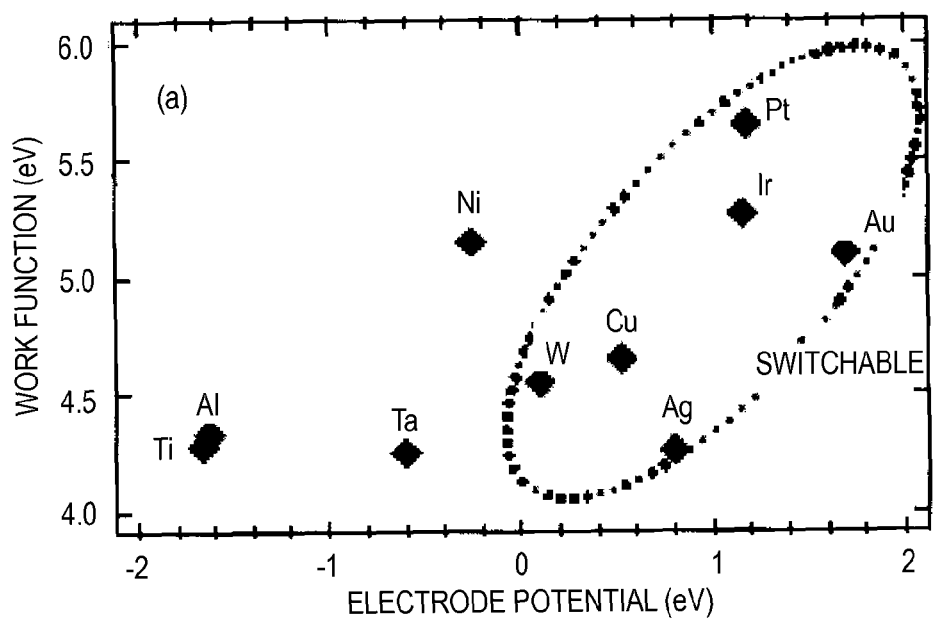
FIG. 15 is a diagram of a relation between electrode potentials and work functions of various metal elements.
Figure 16:
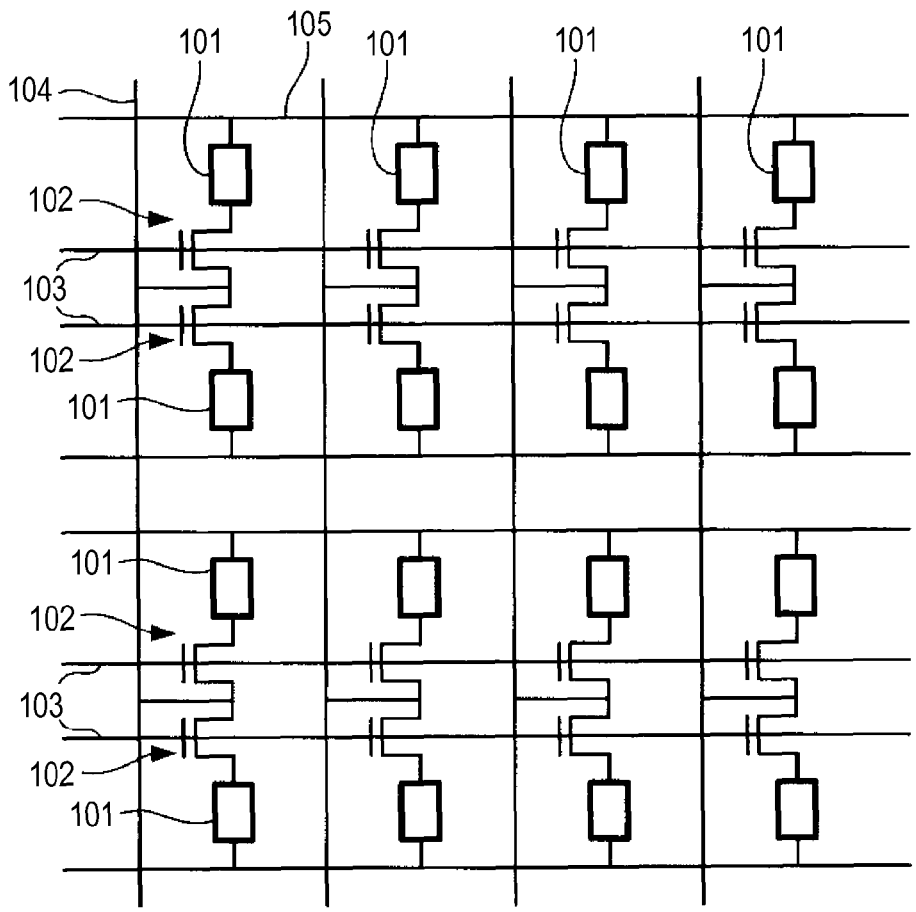
FIG. 16 is a circuit diagram of a memory cell array including variable resistance nonvolatile memory storage elements.
Figure 17A:
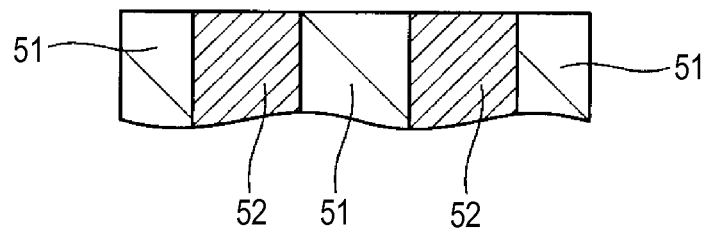
FIGS. 17A to 17D are manufacturing process charts for explaining a method of manufacturing a memory storage device having a structure in which layers are separated for each of memory cells.
Figure 17B:
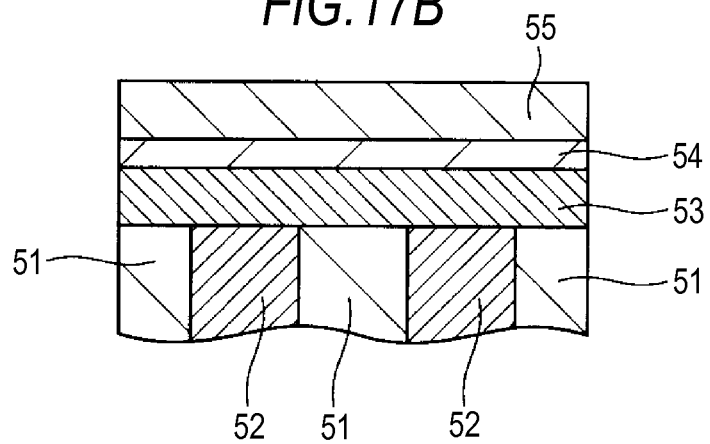
Figure 17C:
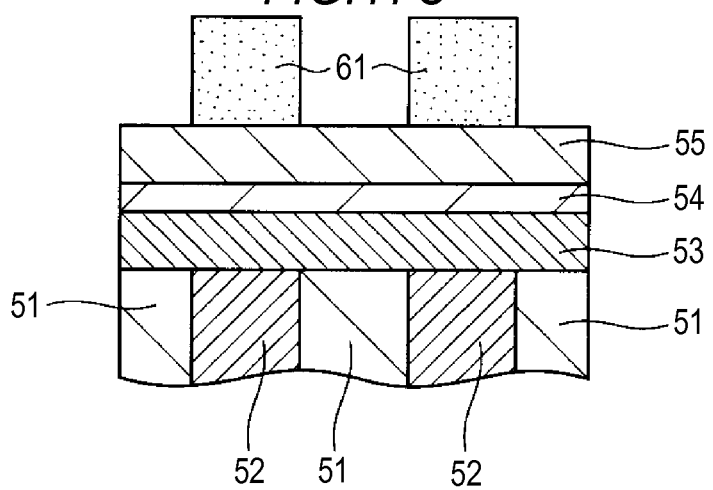
Figure 17D:
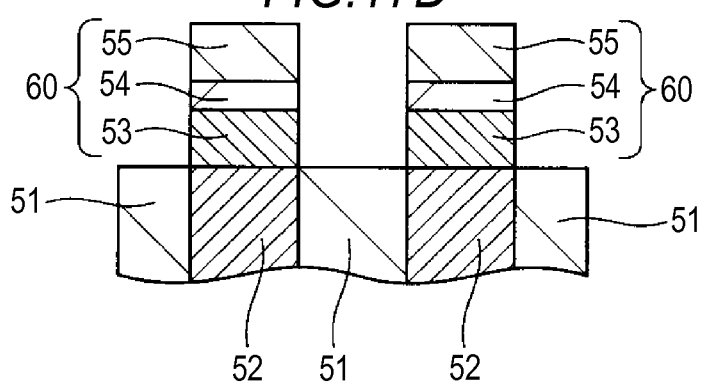
Figure 18A:
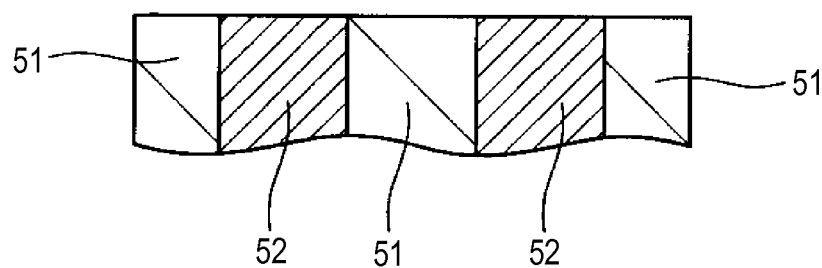
FIGS. 18A to 18C are manufacturing process charts for explaining a first method of manufacturing a memory storage device having a structure in which only a lower electrode is separated for each of memory cells.
Figure 18B:
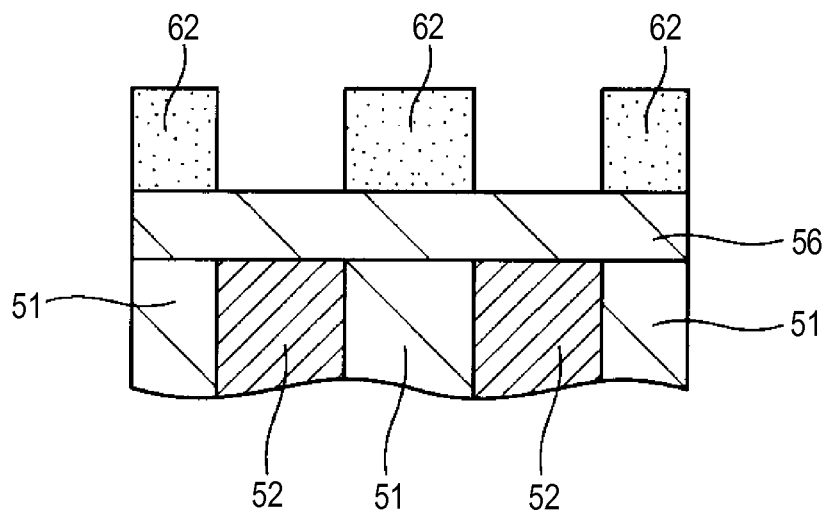
Figure 18C:
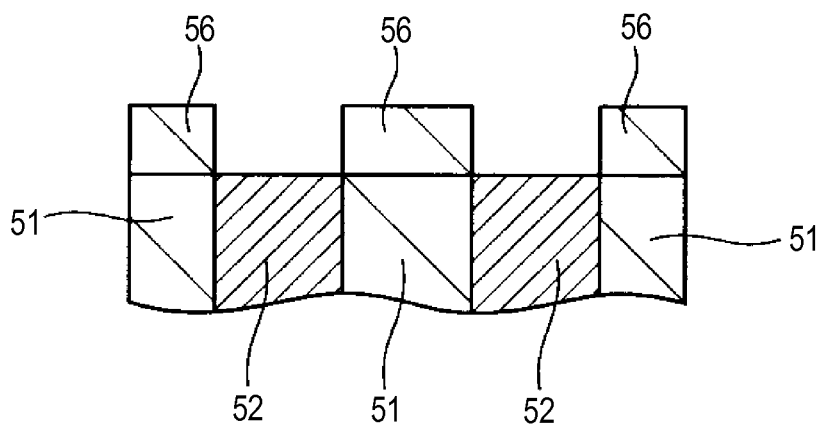

Subsequently, the memory storage layer 14 and the upper electrode 15 are sequentially formed. As shown in FIG. 14H, the memory storage elements 20 including the lower electrodes 13, the memory storage layer 14, and the upper electrode 15 are formed. Consequently, only the metal nitride layers 18 in the lower electrodes 13 are in contact with the memory storage layer 14.

Thereafter, according to necessity, components such as an insulating layer that covers and protects the surface and wires connected to the upper electrode 15 are formed.

In this way, the memory storage device shown in FIG. 12 can be manufactured.

With the configuration of the memory storage device according to this embodiment, since only the silicide layers 19 are in contact with interfaces with the source/drain regions 3 of the MOS transistors in the lower electrodes 13 of the memory storage elements 20, contact resistance with the source/drain regions 3 decreases. Consequently, it is possible to apply desired current and voltage to the memory cells.

Since only the metal nitride layers 18 in the lower electrodes 13 are in contact with the memory storage layer 14, intrusion of metal such as Ti into the memory storage layer 14 is suppressed. Consequently, it is possible to obtain a satisfactory switching characteristic in the memory storage elements 20 of the memory cells.

Therefore, according to this embodiment, since desired current and voltage can be applied to the memory cells and a satisfactory switching characteristic can be obtained, it is possible to accurately and stably perform recording of information in the memory cells and realize a highly reliable memory storage device.

In the embodiments, the memory storage layer 14 and the upper electrode 15 are formed in common to all the memory cells of the memory cell array.

In the embodiment of the present disclosure, a memory storage layer and an upper electrode only have to be formed in common to plural memory cells. For example, the memory storage layer and the upper electrode may be form in common to memory cells in the same row or memory cells in the same column.

Since the memory storage layer and the upper electrode are formed in common to the plural memory cells, difficulty in patterning is further relaxed than patterning performed when the memory storage layer and the upper electrode are formed to be separated for each of the memory cells.

When the memory storage device in which the memory storage layer and the upper electrode are formed in common to the memory cells in the same row or the memory cells in the same column is manufactured, for example, after the memory storage layer and the upper electrode are formed in common to all the memory cells, the memory storage layer and the upper electrode only have to be patterned for each of rows or each of columns of the memory cells.

In the fourth and fifth embodiments, the source/drain regions 3 of the MOS transistors are formed in the silicon substrate 1.

In the embodiment of the present disclosure, source/drain regions of MOS transistors may be formed in, instead of the silicon substrate 1, a silicon epitaxial layer formed on a silicon substrate and lower electrodes of a memory storage element may be directly connected on the source/drain regions.

The present disclosure is not limited to the embodiments. Other various configurations could be adopted without departing from the spirit of the present disclosure.

The present disclosure contains subject matter related to that disclosed in Japanese Priority Patent Application JP 2010-136460 filed in the Japan Patent Office on Jun. 15, 2010, the entire contents of which is hereby incorporated by reference.

What is claimed is:

1. A resistance random access memory comprising:
 a plug portion comprised of polysilicon;
 a first electrode on the plug portion;
 a memory storage portion on the first electrode; and
 a second electrode on the memory storage portion,
 wherein,
   (a) the first electrode includes (1) a first portion comprised of a metal or a metal silicide and (2) a second portion on the first portion, the second portion comprised of a metal nitride, and
   (b) the first portion and the second portion are laminated such that the first portion is in contact with the memory storage portion.

2. The resistance random access memory of claim 1, wherein the metal of the first portion is formed of one or more kinds selected from the group consisting of Ti, Co, Ni, W and Ta.

3. The resistance random access memory of claim 1, wherein the memory storage portion and the second electrode are common to a memory cell.

4. The resistance random access memory of 1, wherein the first electrode and the memory storage portion are separate from each other.

5. A resistance random access memory comprising:
 a lower electrode that includes a metal silicide layer;
 a memory storage layer on the lower electrode, the memory storage layer configured to record information by way of a change in resistance;
 an upper electrode on the memory storage layer; and
 a plug layer under the lower electrode, the plug layer comprised of polysilicon.

6. The resistance random access memory of claim 5, wherein the memory storage layer and the upper electrode are common to a memory cell.

7. The memory storage device according to claim 6, wherein the lower electrode and the memory storage layer are separate from each other.

* * * * *